(12) United States Patent
Jones et al.

(10) Patent No.: US 6,697,768 B2
(45) Date of Patent: Feb. 24, 2004

(54) ADAPTIVE METHOD AND APPARATUS FOR TRANSMISSION LINE ANALYSIS

(75) Inventors: Keith R. Jones, Ramona, CA (US); Gilberto Isaac Sada Treviño, San Diego, CA (US); William W. Jones, San Diego, CA (US); Ragnar H. Jonsson, Raykjavik (IS)

(73) Assignee: Mindspeed Technologies, Newport Beach, CA (US)

( * ) Notice: Subject to any disclaimer, the term of this patent is extended or adjusted under 35 U.S.C. 154(b) by 58 days.

(21) Appl. No.: 10/095,847

(22) Filed: Mar. 11, 2002

(65) Prior Publication Data

US 2002/0169585 A1 Nov. 14, 2002

Related U.S. Application Data

(63) Continuation-in-part of application No. 09/810,932, filed on Mar. 16, 2001.

(51) Int. Cl.$^7$ ............................................... G06F 15/00
(52) U.S. Cl. ...................................... 702/189; 702/190
(58) Field of Search ................................ 324/533, 534; 370/248; 702/57, 58, 79, 108, 159, 182, 184, 189

(56) References Cited

U.S. PATENT DOCUMENTS

| 6,002,671 A | 12/1999 | Kahkoska et al. |
| 6,058,162 A | 5/2000 | Nelson et al. |

*Primary Examiner*—John Barlow
*Assistant Examiner*—Douglas N Washburn
(74) *Attorney, Agent, or Firm*—Weide & Miller, Ltd.

(57) ABSTRACT

A method and system for performing sequence time domain reflectometry to determine the location of line anomalies in a communication channel is disclosed. In one embodiment, the system generates a sequence signal and transmits the sequence signal over a channel. The system receives one or more reflection signals, and performs reflection signal processing on the reflection. In one embodiment, the reflection signal is correlated with the original sequence signal to generate a correlated signal. The system determines a time value between the start of the reflection signal and the subsequent points of correlation to determine a location of a line anomaly. In one embodiment preprocessing and postprocessing occurs to counter the effects of a communication device, such as a DMT modulator/demodulator. In one embodiment sampling of the sequence and reflection signal may occur at different times or at a different phase to provide greater resolution of the line anomaly location.

31 Claims, 28 Drawing Sheets

ADAPTIVE METHOD AND APPARATUS FOR TRANSMISSION LINE ANALYSIS

The following application is a continuation-in-part of the U.S. patent application having Ser. No. 09/810,932, which was filed on Mar. 16, 2001.

FIELD OF THE INVENTION

This invention relates generally to communications and in particular to a system and method for analyzing a transmission line.

RELATED ART

Historically, new communication technologies are continually being introduced to improve the ease and rate at which data can be exchanged between remote locations. One factor that must be considered when communicating electronic data is the medium over which the data will travel. This is often referred to as determining the channel quality, line characteristics, line transfer function, insertion loss, or channel impulse response. Numerous different types of conductors are utilized to conduct communication signals. One example medium that is commonly installed throughout the world is twisted pair conductors as are traditionally used to provide telephone service between a central office telephone facility and a residence or business.

The medium must be considered because the medium and its condition can affect the rate at which communication may occur. For example, digital subscriber line (DSL) technology utilizes twisted pair conductors. The rate at which systems using the DSL standards may operate is determined in part by the electrical characteristics of the twisted pair between a transmitting device and a receiving device. The factors that control the rate of communication may include the distance between the receiver and transmitter, presence of bridge taps or load coils, the quality of the twisted pair, the quality of connections to the twisted pair, and the amount of noise that the twisted pair picks up, such as crosstalk noise. As data communication speeds increase, the quality of the line and the presence of line anomalies become of greater importance.

It may be desirable to determine characteristics of the line prior to communicating data so that a data transmission rate may be determined or so that it may be determined if the line is able to support communications under a particular standard. For example, if certain line anomalies exist between a first communication unit and a second communication unit, it is desirable to learn of these anomalies and their effect on communication through the line. Moreover, it is desirable to determine the location of the anomalies so that repair or removal of the anomaly may occur. In the particular case of bridge taps and load coils, service technicians are dispatched to locate and remove the bridge tap or load coil. The dispatch of service technicians is expensive and hence, the less time the service technician must spend locating the line anomaly, the lower the cost of the dispatch. Therefore, the more accurately the anomaly location is identified, the less costly the service dispatch because the technician may more rapidly find and fix the anomaly.

One prior art method of line analysis, such as for evaluating the effects of or identifying the location of line anomalies comprises transmission of a high power pulse on the line. Impedance irregularities in the line cause a reflection or echo when encountered by the pulse. Time information is used to determine the location of the anomaly.

This method of line analysis suffers from numerous disadvantages. One disadvantage arises as a result of the necessary, but undesirable, use of a high power pulse. Transmission of a high power pulse on a line disrupts communication and operation of the other pairs in the binder by creating crosstalk between pairs. Another disadvantage of this prior art method arises because of the available echo processing methods. The in-use pairs in the binder with the line being tested create crosstalk in the line being tested. This limits a system's ability to detect weak return echoes which translate into a limitation on the ability of prior art pulse system to accurately analyze the distant end of a long line. Yet another drawback associated with the prior art method of high power pulse reflection analysis is the limited platforms available to generate a high power pulse. As a result, pulse test equipment must be implemented as a separate piece of test equipment and may not be an integrated circuit. This increases the cost of testing by requiring a separate piece of test equipment and can make its use inconvenient.

The invention overcomes the disadvantages of the prior art by providing a method for apparatus for sequence time domain reflectometry.

SUMMARY

In one embodiment, the invention comprises a line probe signal and method of generating the same for use in determining line characteristics. In one embodiment, the invention comprises a method and apparatus for processing a line probe signal to determine channel characteristics, such as to determine the location and type of one or more line anomalies. Line anomalies may comprise open circuit, short circuit, bridge taps, load coils, moisture on the line, or any other aspect that creates an impedance mismatch.

In one embodiment, a method for performing time domain reflectometry on a communication channel comprises generating a sequence signal and transmitting the sequence signal over a communication channel. In one embodiment the sequence signal has an autocorrelation function, which approximates a Kronecker delta function. The communication channel may comprise any channel such as but not limited to fiber optic cable, coaxial cable, power transmission line, network line Ethernet, twisted pair or any channel capable of conducting data. Next, the system receives one or more reflection signals from the communication channel in response to the transmission of the sequence signal. After receipt of the reflection signal, the system correlates the reflection signal with the sequence signal to generate a correlated signal. Due to the autocorrelation properties of the sequence signal, the correlated signal is a linear combination of the near-end echo and the echoes from one or more anomalies. Next, the system may retrieve a template signal. The template signal corresponds or is representative of the near-end echo in the reflection signal. After retrieving the template signal, the system aligns the template signal and the correlated signal to determine a point of alignment. The point of alignment may comprise when the two signal are most similar. Once aligned, the method subtracts the template signal from the correlated signal to remove near-end echo from the correlated signal. Other aspects of the reflection signal may be removed other than near-end echo. Next, the system measures a time interval between the point of alignment and a subsequent peak in the correlated signal. This reveals the amount of time it took for the signal to propagate to a line anomaly and for the reflection signal to return to the receiver. When the propagation time is determined, the system multiplies the time interval by the rate of propagation of the sequence signal through the communication channel to obtain a distance to a line anomaly. The rate of propagation for an electrical signal through a channel is generally known for different channel mediums. In one embodiment the method further includes dispatching a service technician or other personnel to fix the line anomaly.

In various other configurations or embodiments, the template signal may be measured or created by correlating the reflection from a long cable of the type to be tested and known to be free of anomalies or the template may be derived from a detailed circuit analysis of the transceiver and the line interface. In one embodiment, the sequence signal is transmitted at a power level that does not introduce crosstalk into other communication channels.

In another variation or embodiment, the method of operation also performs a circular rotation of the sequence signal to create a rotated sequence signal and transmits the rotated sequence signal over the communication channel. A rotated reflection signal is received and correlated with the rotated sequence signal that was transmitted to create a rotated reflection signal. This correlated rotated signal is aligned with the correlated signal and combined with the correlated signal to reduce or remove correlation artifacts on the correlated signal.

To realize this method of operation, various different configurations of hardware and/or software may be utilized. In one embodiment, a system performs sequence time domain reflectometry to determine the location of impedance mismatches on a channel being configured to communicate data using a digital subscriber line standard. This embodiment comprises a sequence generator configured to generate a maximal length sequence signal connected to a transmitter that is configured to transmit the sequence signal on a channel. This causes the sequence signal to propagate through the channel, the channel being analyzed to determine the location of impedance mismatches or other line anomalies that may affect data transmission. A receiver is configured to receive one or more reflections that result from the sequence signal encountering impedance mismatches as it propagates through the channel. A correlator connects to the receiver and correlates the received signal, which is comprised of one or more reflections, with the sequence signal to generate a correlated signal, which is the linear combination of the impulse responses of the transmission paths to the one or more anomalies. Also included in this configuration is a processor, other hardware or software, configured to determine the time period between a beginning of the sequence signal transmission as determined from the peak of the near-end echo response and the peak of the echo response from the one or more anomalies. The processor, other hardware or software, is configured to calculate a value corresponding to a channel length between the system and an impedance mismatch.

The invention can be implemented from only one end of the channel, such as when access is possible or convenient to only one end, or when invention may be performed at any point along the channel. The invention may be used to classify the line or channel into a data transmission rate group, a cost of service group, or simply whether or not to use the line for high speed data communication. In one embodiment the distortion of the pulse by the transmission medium may be analyzed to discriminate between various types of anomalies.

In one or more other embodiments, the system may include various other features or aspects. In one embodiment, the system is embodied on a communication device configured to communicate data using a digital subscriber line standard. In one embodiment the sequence generator comprises a tapped delay line.

In one embodiment, the invention utilizes an echo cancellation method of operation to perform time domain reflectometry processing. A method of operation based on this alternative embodiment includes processing a reflection signal resulting from transmission of a sequence of bits over a channel to determine the location of line anomalies. This occurs by providing the generated sequence (not correlated with the transmit sequence) to a prediction module, which, in one embodiment, is comprised of a finite impulse response, adaptive filter. The coefficients of the prediction filter are adapted such that the output of the prediction filter approximates the received reflection sequence when the transmit sequence is applied to the input of the filter. When this adaptive procedure converges, the coefficients of the adaptive filter are an estimate of the linear combination of the near-end echo response and the responses from the one or more anomalies.

This method of operation may further include analyzing the coefficient values when the prediction filter output generally resembles the reflection signal to determine the location of impedance mismatches on the channel. In one particular embodiment the prediction filter comprises a finite impulse response filter. In one embodiment the sequences of bits may comprise a sequence selected from the group of sequences consisting of a maximal length sequence, a Barker code, or a Kasami sequence. It should be noted that comparing may include subtracting the prediction filter output from the reflection signal.

The scope is not limited to only the described combinations but is intended to cover any various combination as might be contemplated after reading the specification and claims. Hence an embodiment may include one feature or element or any combination or number of features or elements.

Other systems, methods, features and advantages of the invention will be or will become apparent to one with skill in the art upon examination of the following figures and detailed description. It is intended that all such additional systems, methods, features and advantages are included within this description, are within the scope of the invention, and are protected by the accompanying claims.

BRIEF DESCRIPTION OF THE DRAWINGS

The components in the figures are not necessarily to scale, emphasis instead being placed upon illustrating the principals of the invention. Moreover, in the figures, like reference numerals designate corresponding parts throughout the different views.

DETAILED DESCRIPTION

Figure 1:
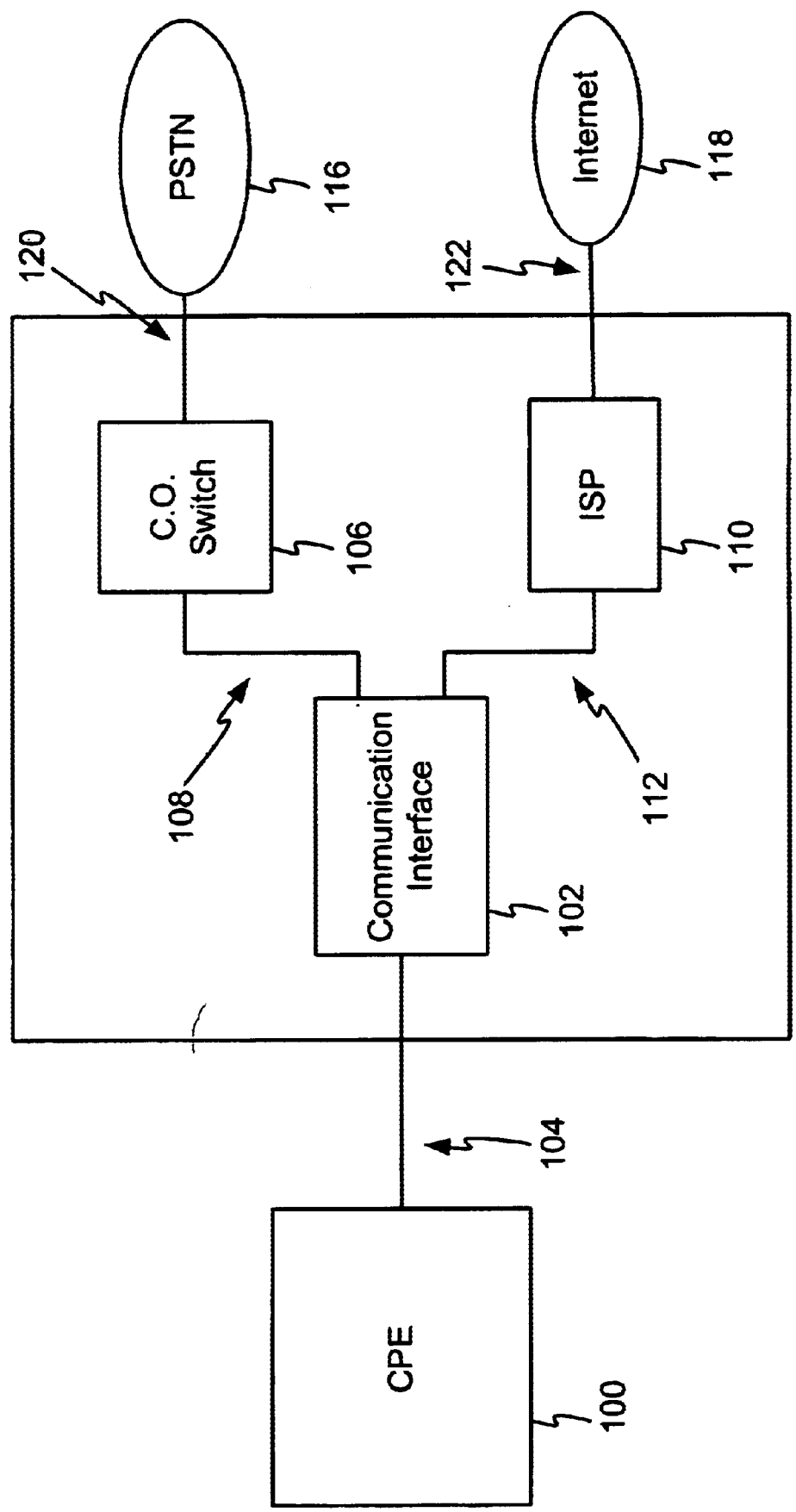
FIG. 1 is a block diagram of an example environment of use of the invention.

FIG. 1 illustrates an example environment for use of the invention. The example environment shown in FIG. 1 is provided for purposes of discussion and is not in any way intended to limit the scope or breadth of the invention. It is contemplated that the invention may find use in a plurality of other environments, such as any environment where it is desired to obtain information regarding line characteristics for the purposes of communication over the line, line repair or line classification. The line to be probed may comprise any type of conductor or channel including, but not limited to, a twisted pair conductor, coaxial cable, Ethernet, an optic channel, or a radio frequency waveguide.

FIG. 1 illustrates customer premise equipment (CPE) 100 in communication with a communication interface 102 over a first line 104. The CPE 100 comprises any communication device that is generally located remote from the communication interface 102 and configured to facilitate communication over the first line 104. In one embodiment, the CPE 100 comprises a communication modem or communication device located at a business or residence. The CPE 100 may comprise, but is not limited to, any device operating under the digital subscriber line (DSL) standard, any voice band modem, cable modem, wireless modem, power line modem, or any other device configured to perform digital or analog communication. It is contemplated that contained in the CPE 100 and the communication interface 102 there is a receiver and transmitter configured to send and receive data over the line 104.

The first line 104 may comprise any communication medium intended to carry communication signals. In various embodiments the first line 104 comprises, but is not limited to, one or more conductors of a twisted pair of conductors, coax cable, power line, optic cable. Although the first line 104 is shown as a single line, it should be understood that the line 104 may comprise any configuration or number of conductors, optical paths, or other such paths. Other lines, channel, or paths or conductors shown throughout the figures may likewise comprise any configuration or number of conductors, optical paths, or other such paths.

In this embodiment, the communication interface 102 comprises any communication equipment configured to communicate with the CPE 100 over the first line 104. With regard to the DSL standard, the communication interface 102 may comprise a digital subscriber line access multiplexer (DSLAM). A DSLAM is configured to facilitate communication over the first line 104 between the CPE 100 and a central office (CO) switch 106 and an Internet Service Provider (ISP) 110. The DSLAM may include modems or other communication devices.

Communication with the CO switch 106 occurs over a second line 108 while communication with the ISP 110 occurs over a third line 112. The communication interface 102 appropriately routes certain voice communication from the CPE 100 to the CO switch 106 while appropriately routing certain data communication from the CPE to the ISP 110. As shown, the CO switch 106 may connect to the PSTN 116 thereby serving as a switching and routing service for telephone, facsimile, or data calls. The ISP 110 may connect to the Internet 118 to provide access to a plurality of other networked computers.

It is contemplated that the various embodiments of the invention may be used to evaluate the characteristics of the first line 104, the second line 108, the third line 112, or lines 120 and 122 to thereby determine characteristics of the line, such as but not limited to the location of line anomalies that may effect data transmission. It is desired to obtain the highest data rate supportable by the lines 104, 108, 112, 120, 122 so that a maximum amount of data may be transferred in a minimum amount of time with the fewest number of errors. This enables more rapid upload, downloads, and greater and more reliable use of the lines 104, 108, 112, 120,

122. It is also contemplated the invention may be practiced at any location in the communication system. In one preferred embodiment, the invention is integrated with modems at the communication interface 102, the C.O. switch 106, or the communication interface 102. The invention may also be used to determine a line characteristics for each leg or path for symmetrical communication (identical or similar data transmission rates between devices) or asymmetrical communication (different data transmission rates between devices).

Figure 2A:
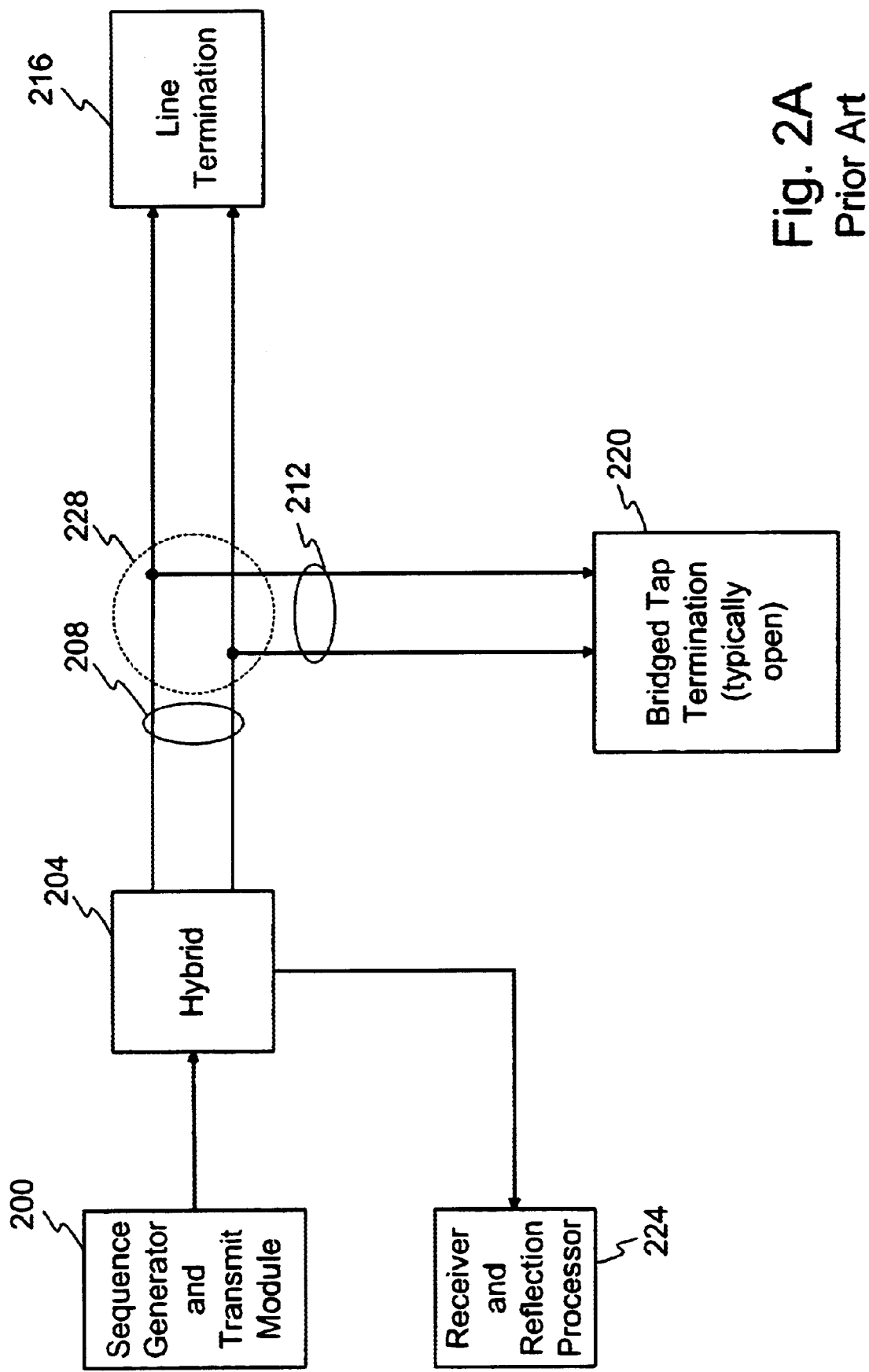
FIG. 2A illustrates a block diagram of example embodiment in relation to a communication line and an example line anomaly.

FIG. 2A illustrates a block diagram of example configuration in relation to a communication line and an example line anomaly. A sequence generator and transmit module 200 connect to a hybrid 204. The hybrid 204 connects to channel 208. In one embodiment, the channel 208 comprises a twisted pair conductor. In another embodiment, the conductor comprises fiber optic cable. In yet another embodiment, the channel may comprise coaxial cable or radio waveguide.

The opposite end of the channel 208 connects to a line termination 216. It is contemplated that the line termination 216 may comprise an open circuit, short circuit, or a termination impedance matched to the line. Both an open circuit and a short circuit create reflections. Although not the case in every channel, for purposes of understanding a line anomaly 220 resides between the hybrid 204 and the line termination 216. In the embodiment shown in FIG. 2, a conductor 212 is spliced into the channel 208 forming a bridged tap. The bridged tap is typically terminated in an open circuit. In one embodiment, the conductor 212 comprises the same type channel material as the channel 208. In another embodiment, the conductor 212 comprises the same general class of transmission line with slightly different properties, such as wire gauge. Other line anomalies may include an open circuit or a short circuit in the channel cable 208. It is contemplated that the line anomaly may be located at any distance from the point at which the test is applied and, in the case of a bridged tap, the spliced cable may be of any length. Hence, the conductors 208 and 212 may assume any length.

The hybrid 204 also connects to a receiver and reflection module 224 that is configured to monitor for and receive reflection signals from the hybrid arriving over the channel 208.

The sequence generator and transmit module 200 comprises a configuration of software, hardware, integrated circuit, analog system, or some combination thereof that is collectively configured to generate a sequence signal in accord with the teaching discussed below. It is contemplated that the sequence generator portion of the module 200 generates a sequence signal for transmission over the channel 208. As discussed below in greater detail, the sequence signal has numerous advantages over the prior art use of a single high power pulse when used for time domain reflectometry. Any type of sequence signal may be utilized and is compatible with and covered by the scope of the invention. In one embodiment, a sequence signal with good autocorrelation properties is used. In one embodiment it is desired to have a signal with a generally flat frequency response across the frequency spectrum that will be used for communication. Several different example sequence signals are provided below for purposes of understanding. However, the invention is not limited to the specific sequences specified in this document. Further, numerous different types of transmitters, modulator, filters and other transmit components may be adopted for use and are contemplated as being covered by the claims. The invention is not limited to any particular type of transmit system.

In one embodiment, the sequence generator portion of the module 200 is embodied in software and configured to execute in conjunction with a processor to generate a physical electrical signal. Any type of processor, hardware, or integrated circuit may execute the software code. The software may be stored in memory or any computer readable medium.

The hybrid 204 operates as understood in the art. It is designed to allow the signal 110 received from the channel 208 to pass through to the receiver but to minimize the amount of the transmit signal which is directly coupled into the receiver. There is, in general, some residual signal directly coupled to the receiver and this is termed the near-end echo.

The line anomaly comprises any connection, break, disruption or aspect that creates an impedance mismatch. When encountered by a signal, such as a sequence signal, this mismatch creates a reflection that echoes back in the direction of the received signal. In one embodiment, the line anomaly 220 comprises a load coil. In another embodiment, the line anomaly 220 comprises a bridge tap. Other line anomalies include but are not limited to, semi-open or short circuits, moisture or corrosion on the line, or a change in wire gauge.

The receiver and reflection processor 224 comprises a configuration of software, hardware, integrated circuit, analog system, or some combination thereof that is collectively configured to receive a reflection sequence signal and process the reflection sequence signal to obtain information regarding anomalies on the channel 208. As discussed below in greater detail, the sequence signal has numerous advantages over the prior art signal of a high power pulse when used for time domain reflectometry. Any type of reflected sequence signals may be processed and is contemplated as being compatible with and covered by the scope of the invention. Further, numerous different types of receivers, demodulator, filters, or other transmit components may be adopted for use. The invention is not limited to any particular type of receiving system.

In one embodiment, the receiver and reflection processor 224 is embodied in software and configured to execute on a processor. Any type of processor, hardware or integrated circuit may be used to execute the software code. The software may be stored in memory or any computer readable medium.

Figure 2B:
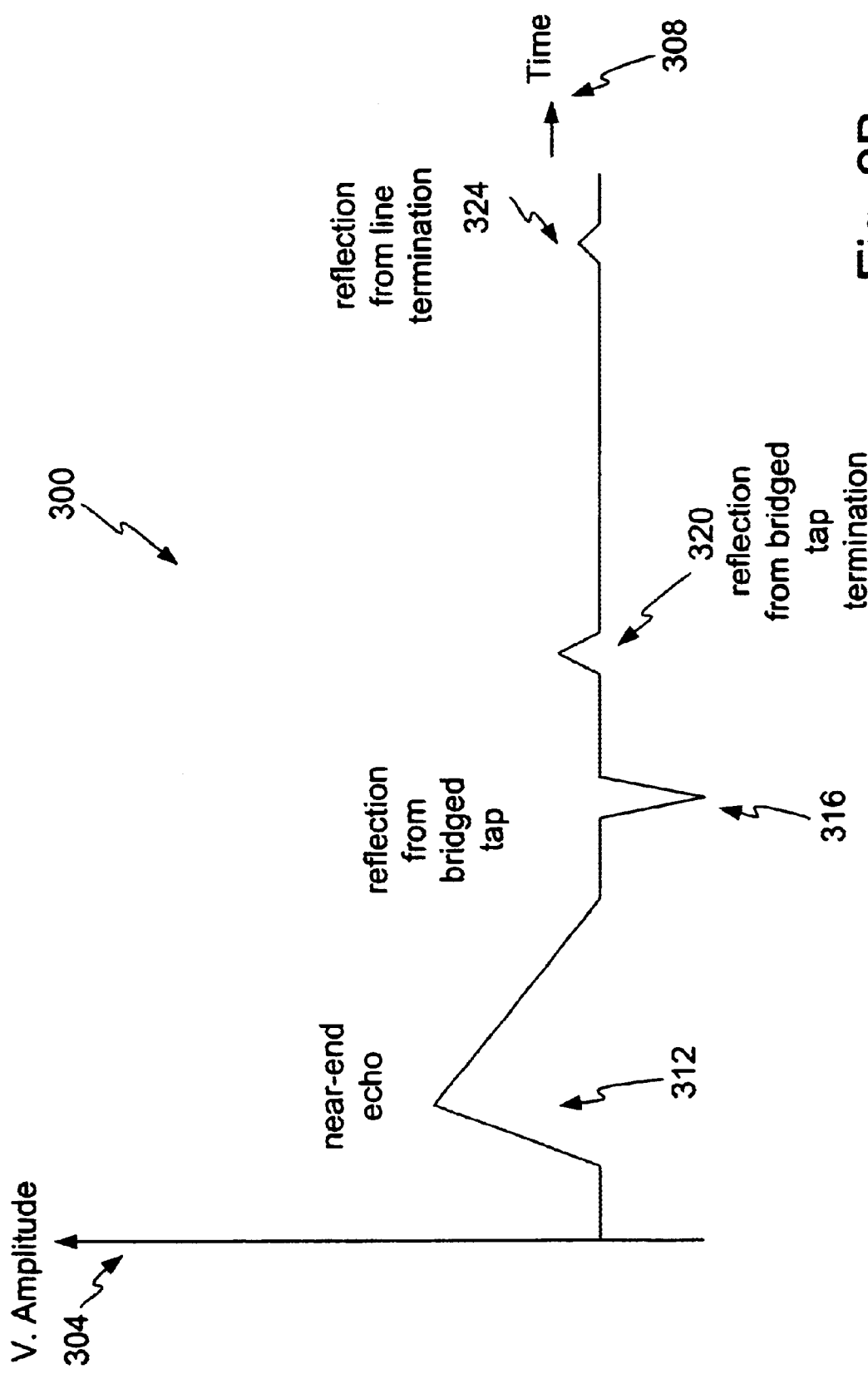
FIG. 2B illustrates a plot of an example reflection signal as may be generated by and correspond to the exemplary embodiment of FIG. 2.

FIG. 2B illustrates an example plot of a reflection signal as may be generated by and correspond to the exemplary configuration of FIG. 2A. FIG. 2B is described with reference to FIG. 2A. The reflection signal plot 300 is in relation to a vertical axis 304 representing voltage and a horizontal axis 308 representing time. The plot 300 is generated by processing in accord with the invention in response to sending a sequence signal on the channel, receiving the reflection signal, and then processing the reflection signal. The processed reflection signal 300 reveals peaks or points of reflections at a time 312, 316, 320, and 324. The peak at time 312 corresponds to the impedance mismatch created by the hybrid 204. In some embodiments, the peak at time 312, caused by the hybrid, is of significantly greater magnitude than the other peaks.

The peak at time 316 corresponds to the impedance mismatch created by the anomaly 228 (FIG. 2A) caused by the connection of conductor 212 to channel 208. The peak at time 320 corresponds to the impedance mismatch created by the line anomaly 220. The peak at time 324 corresponds to the impedance mismatch created by the line termination 216. Based on the time between pulses and the rate of propagation of a signal through the medium of the channel, the location of the anomalies or other impedance mismatches may be determined. By way of example, the propagation speed for category 3 twisted pair cable is about two-thirds the speed of light.

If the anomaly causes an impedance mismatch resulting in a decreased impedance, the reflection will have opposite polarity relative to the incident signal. If the anomaly causes an increase in impedance, the reflection will have the same polarity as the incident signal. Thus, an open circuit will produce a positive return while a short circuit will produce a negative return. In this manner the invention also provides information regarding the type of line anomaly. Other discontinuities may also be mapped.

Figure 2C:
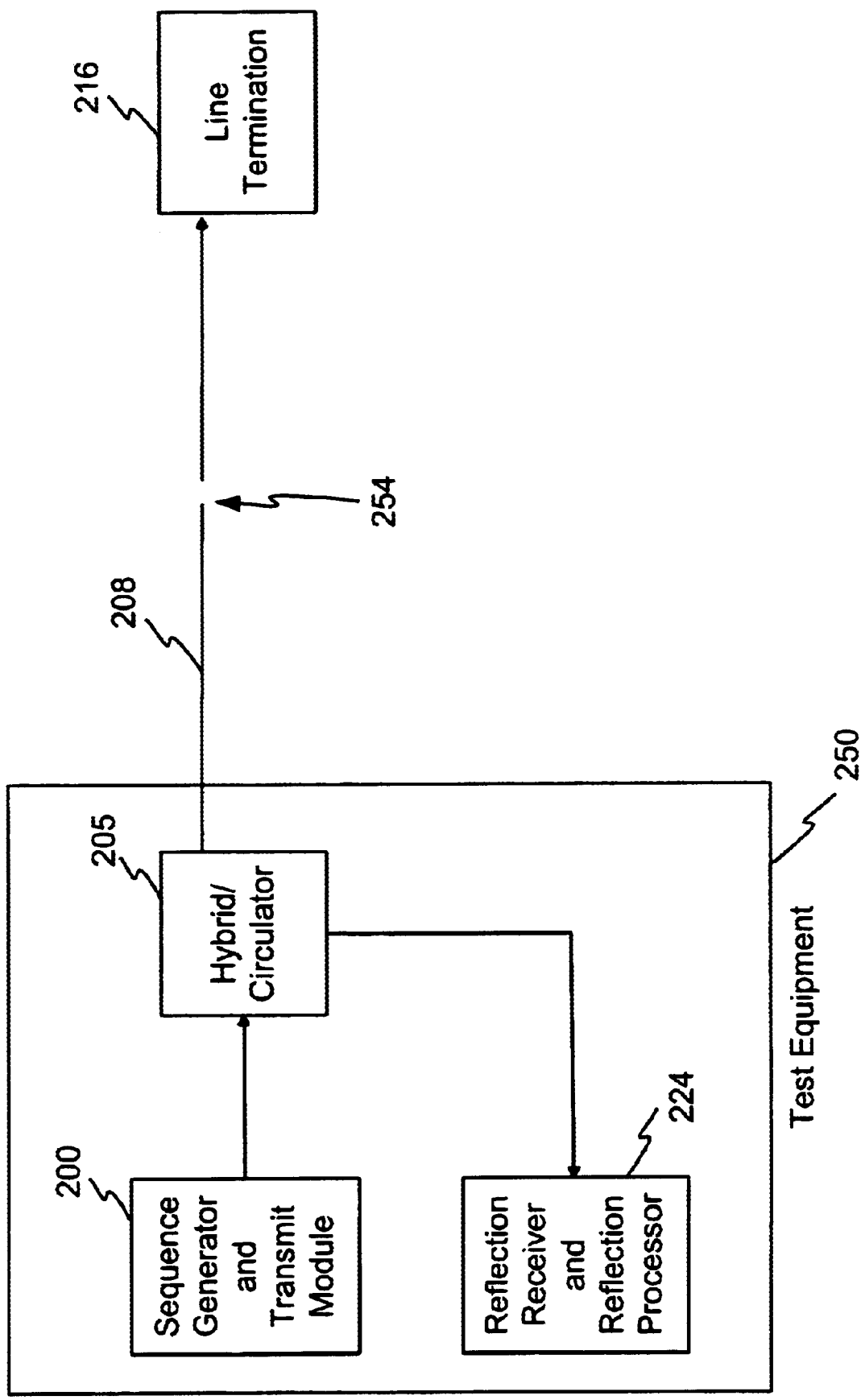
FIG. 2C illustrates a block diagram of example embodiment configured as test equipment.

FIG. 2C illustrates a block diagram of an example embodiment configured as test equipment. As FIG. 2C is similar FIG. 2A, only portions that are different from FIG. 2A are discussed. In the embodiment shown in FIG. 2C, the sequence generator and transmit module 200 and reflection receiver and reflection processor 224 are located in or configured as test equipment 250. A hybrid/circulator 205 selectively directs the sequence signal through the channel and directs the reflection signal to the reflection receiver 224. The test equipment 250 outputs the signal over a line 208 to detect a location or severity of a fault 254. Any type of fault or line anomaly may exist and the line 208 may comprise any medium including, but not limited to, metallic conductors and optic fibers. The test equipment 250 may comprise any type of test equipment configured to analyze a line, determine the location of a line fault, or determine a transmission capacity of a line.

Sequence Signals

In one configuration, the invention comprises use of periodic sequences for channel analysis. In one configuration, the invention comprises use of any sequence with good autocorrelation properties. The autocorrelation function of a sequence represented in continuous time, C(t), is given by:

$$R(t) = \int_{-\infty}^{+\infty} C(\tau)C(\tau + t) d\tau$$

One autocorrelation property is the Dirac delta function where R(t) equals infinity when t equals zero and R(t) equals zero for all other values of t. For practical finite sequences this can not be achieved. Therefore, with R(t) scaled such that the maximum value of R(t) equals one, we define good autocorrelation properties as $1-a \leq R(t) \leq 1$ for $-p \leq t \leq +p$ $-e \leq R(t) \leq +e$ for $t \leq -(p+d), t \geq (p+d)$ where a and e are small percentages of one, p is a percentage of the sequence symbol period and d is a small percentage of p. Bounded by these requirements the values of a, e, p and d may be selected to provide the desired sequence signal.

In one embodiment, the value 'e' is directly related to the period of the M-sequence. If 'e' is too large, the correlation process will result in a side lobe. Hence, a small 'e' is desired but not required. In one embodiment, 'e' is between 15% and 40% of one. In a more preferred embodiment, 'e' is between 5% and 15% of one. In a most preferred embodiment, 'e' is less than 5% of one. Similarly, in an embodiment, 'd' is between about 15% and 45% of one. In a more preferred embodiment, 'd' is between about 5% and 15% of one. In a most preferred embodiment, 'd' is less than about 5% of one. It is preferred to reduce 'p', however, it is contemplated that various values of 'p' between zero and sequence symbol period. Thus, it may range from zero to one. The value 'a' influences width of the autocorrelation function. In some embodiments, a narrow impulse is desired. In one embodiment, 'a' is between about 15% and about 45% of one. In a more preferred embodiment, 'a' is between about 5% and about 15% of one. In a most preferred embodiment, 'a' is less than about 5% of one.

In one embodiment, a requirement on R(t) in the transition region defined by d is that the function be reasonably smooth and decreasing. Therefore, use of sequences with good autocorrelation properties closely approximating an impulse can quickly and accurately provide the desired reflection response information.

The autocorrelation function of a sequence represented in discrete time, C(n), is given by $$R(n) = \sum_{k=-\infty}^{\infty} C(k)C(k + n)$$

One autocorrelation property in this case is the Kronecker delta function where R(n) equals one when n equals zero and R(n) equals zero for all other integer values of n. Again, for practical finite sequences this function cannot be achieved. So, with R(n) scaled such that R(0) equals one, we define good autocorrelation properties as $R(n)=1$ for $n=0$ $-e \leq R(n) \leq +e$ for $n \neq 0$ where e is a small percentage of one. In one embodiment, the e is directly related to the period of the M-sequence. If e is too large, the correlation process will result in a side lobe. Hence, a small e is desired but not required. In an embodiment, 'e' is between 15% and 45% of one. In a more preferred embodiment, 'e' is between 5% and 15% of one. In a most preferred embodiment, 'e' is less than 5% of one.

One example of a sequence well suited to be a line probing signal comprises maximal length sequences (hereinafter M-sequences). M-sequences can be defined as a positive integer with no internal periodicity. An M-sequence can be defined by the following equation:

$G(X) = g_m X^m + g_{m-1} X^{m-1} + g_{m-2} X^{m-2} + \ldots + g_2 X^2 + g_1 X + g_0$ with coefficients that are binary and where each arithmetic operation is performed modulo two. When constructed as an M-sequence, the length or period of the sequence is defined as $2^m - 1$.

Sequences are desirable signals for numerous reasons. One reason is that sequences can be generated by binary logic circuits, such as a scrambler or linear feedback shift register. Another desirable aspect of sequences is that they may be generated at very high speed because of the type of logic utilized to generate the sequence. Standard flip-flop and combinational type logic may be used to generate these types of sequences. Yet another desirable aspect of sequences, and M-sequences in particular, is that these sequences possess good autocorrelation properties that may be processed to closely approximate an impulse at a point of correlation.

Sequences as contemplated by the invention may be implemented or created in various ways. One method of M-sequence generation comprises use of linear feedback shift registers. One example linear feedback shift register configuration comprises a Fibonacci implementation consisting of a shift register where a binary weighted modulo 2 sum of the taps is fed back to the input. Another example implementation comprises a Galois implementation consisting of a shift register, the contents of which are modified at every step by a binary weighted value of the output stage.

This describes several particular types of sequence signals and is provided for purposes of providing an enabling disclosure for at least one class of sequences, however, the above description should not in any way limit the scope of the claims or invention. Any type of sequence may be utilized to obtain the advantages over the prior as described herein.

Figure 3:
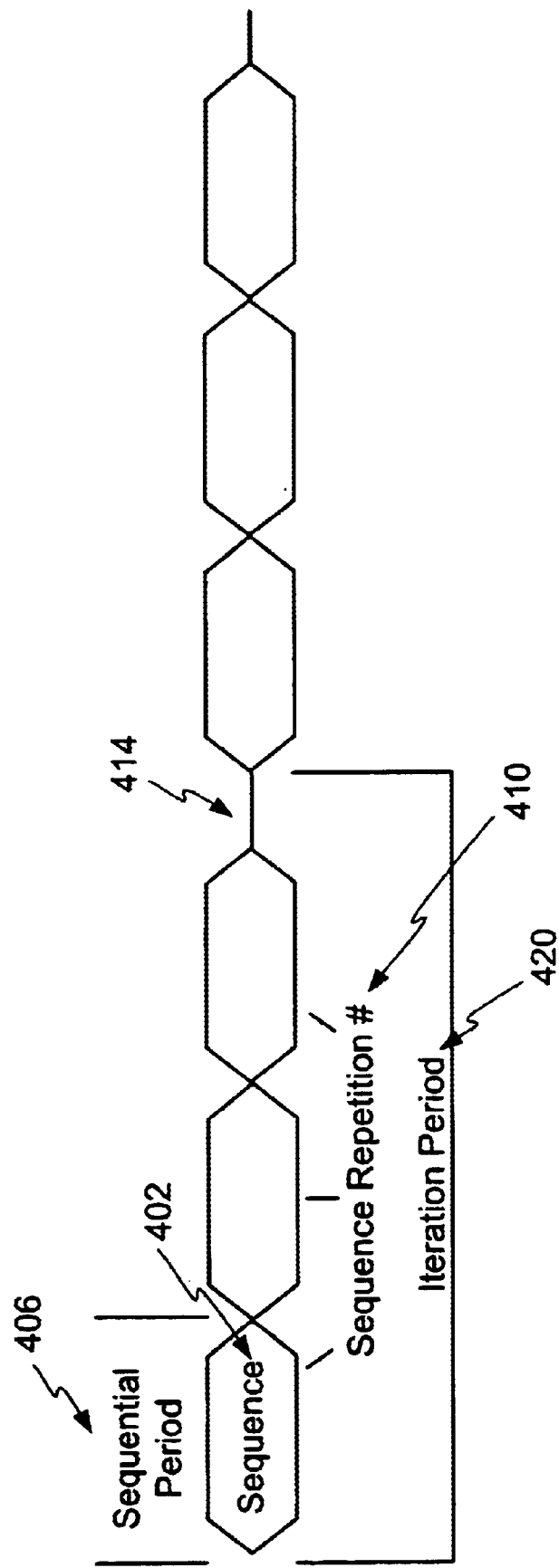
FIG. 3 illustrates a plot of an example sequence transmission pattern.

FIG. 3 illustrates a plot of an example sequence transmission pattern. It is contemplated that the sequence signal may be repeatedly generated and transmitted on the line in any various sequence. The sequence includes sequence period 406. Any number of sequence repetitions 410 may be combined. A silence period 414 may also be provided after a sequence repetition 410. The sequence repetition may comprise any number of sequences 402. A silence period 414 may optionally be provided between certain sequences. An iteration period 420 comprises a repeating group of sequences repetitions 410 and an optional silence period 414. In one embodiment, two or more sequence repetitions 410 or sequences 406 are transmitted in a row. Other combinations than the iteration period 420 shown in FIG. 3 are contemplated. FIG. 3 is provided for purposes of understanding and providing terminology to aid in understanding.

Example Embodiment

Figure 4:
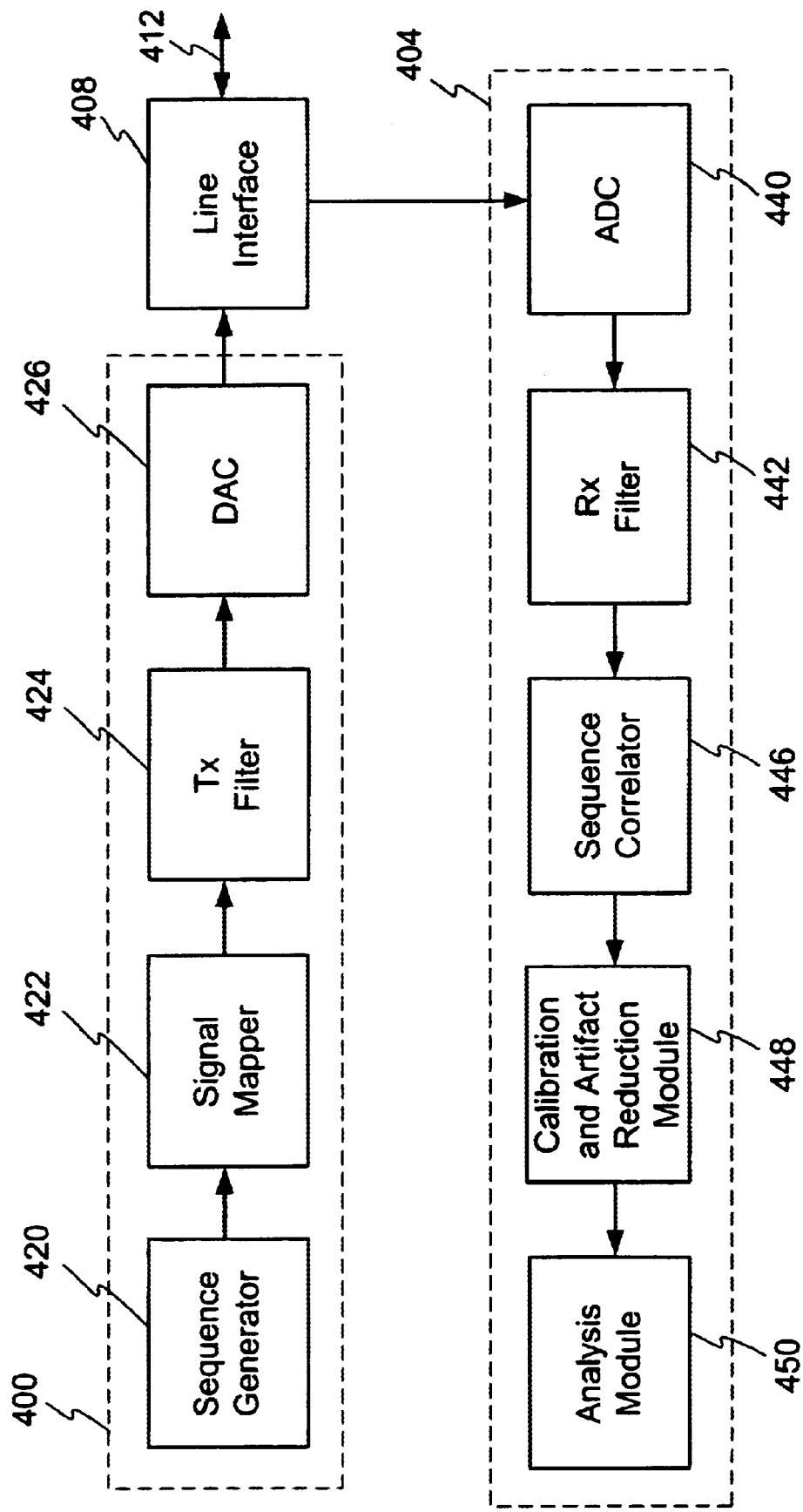
FIG. 4 illustrates a more detailed block diagram of an example embodiment of one configuration of the invention.

FIG. 4 illustrates a more detailed block diagram of an example embodiment of one configuration of the invention. Broadly, the elements of FIG. 4 includes a transmit module 400 and a receive module 404. Connecting the transmit module 400 and the receive module 404 is a line interface 408 and other possible logic and lines (not shown). The line interface 408 connects the transmit module 400 and the receive module 404 to a communication channel 412. The line interface 412 includes apparatus to separate or filter the transmitted signal from the received signal and attempts to impedance match the transmit module 400 to the channel 412 and the receive module 404 to the channel. In one embodiment, the line interface 408 comprises a hybrid. The line interface 408 may also be configured to interface a single conductor of the transmit module 400 or the receive module 404 to twisted pair conductors. Although designed to reduce impedance mismatch, the line interface 412 often creates some mismatch and hence may create a reflection during operation of the sequence time domain reflectometry as described herein. This reflection may be referred to near-end echo.

In the example embodiment of the transmit module 400 shown in FIG. 4, a sequence generator 420 connects to a PAM mapping module 422. The sequence generator 420 generates a sequence signal. The output of the PAM mapping module connects to one or more transmit filters 424. The transmit filters 424 provide the sequence signals to a digital to analog converter 426 and the output of the analog to digital converter connects to the line interface 408.

With regard to the receive module, the line interface is configured to receive and direct any reflection signals to an analog to digital converter 440. The output of the analog to digital converter 440 connects to one or more receive filters 442 and the output of the receive filters connects to a sequence correlator 446. The output of the sequence correlator 446 connects to a calibration and artifact reduction module 448, which in turn connect to an analysis module 450.

Transmit Module

The function of each element is now briefly described with more emphasis on the elements that are of greater importance to the operation of the invention and which may not be as well known. The sequence generator 420 comprises any apparatus or system configured to generate a sequence signal for transmission over the channel 412. In one embodiment the sequence generator 420 comprises at least partly software. In one embodiment the sequence generator creates a maximal length sequence (M-sequence). In another embodiment the sequence generator creates a Barker Code type sequence. In yet another embodiment, the sequence generator creates a Kasami type sequence. In the embodiment shown in FIG. 4 having a sequence correlator 446, it is desirable for the sequence to have good autocorrelation or cross correlation properties.

In one embodiment, the sequence generator 420 is embodied in a scrambler to generate a pseudorandom bit pattern or sequence in an attempt to output a data stream without long sequences of constant voltage values. Various different embodiments exist for generating a sequence signal.

Figure 5:
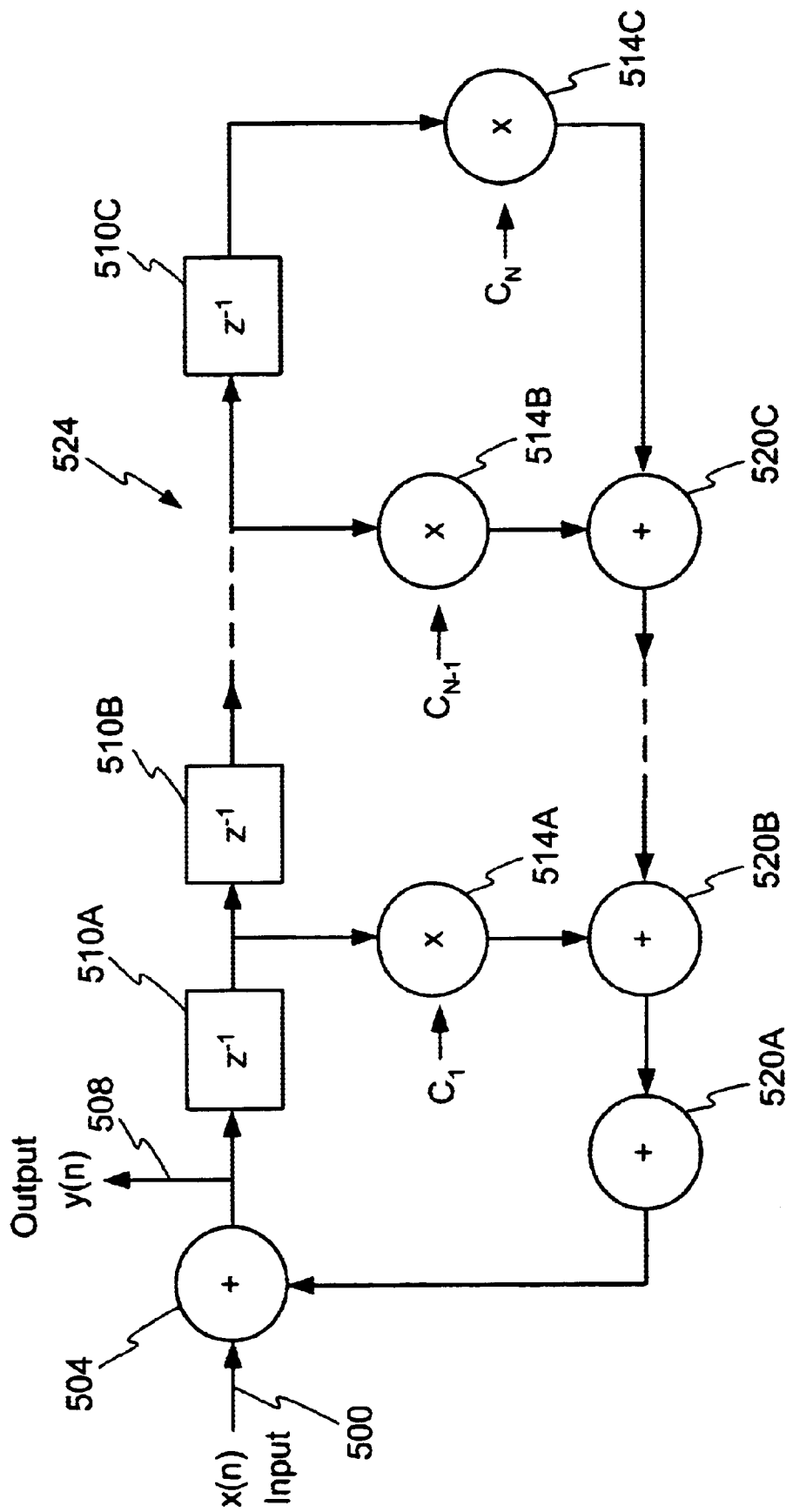
FIG. 5 illustrates a block diagram of an example embodiment of a sequence generator configured using a linear feedback shift register type implementation.

FIG. 5 illustrates a block diagram of an example embodiment of a sequence generator configured using a linear feedback shift register or scrambler type implementation. An input 500 connects to a summing unit 504. All arithmetic operations may be performed in a modulo-2 fashion. The summing unit 504 has an output connected to an output line 508 and a delay register 510A. The output of the delay register 510A connects to a multiplier 514A, having a multiplier set to $C_1$, and to another delay register 510B. The output of delay register 510B connects to N number of other delay registers and multipliers until connecting to a delay register 510C and to a multiplier $C_{N-1}$. The output of delay register 510C connects to a multiplier 514C that has a multiplier CN. This creates an Nth order generator due to the N memory elements or delay registers 510. This thus generates an output based on the content of the registers, also known as the state of the scrambler. Thus, the total number of different possible states of the generator is $2^N$.

In one example method of operation, a continuous sequence of logic value 1's is provided to the input 500. The state of each register may be selectively loaded with a logical one or a logical zero based on the desired sequence to be generated. When provided with a string of logics one values, the generator outputs a unique string, or sequence, of 1's or 0's based on the values of the registers 510. In one embodiment, the values loaded into the registers are selected to form a primitive polynomial known to generate a maximal length sequence (M-sequence). The sequence will repeat through the $2^N-1$ non-zero states.

Figure 6:
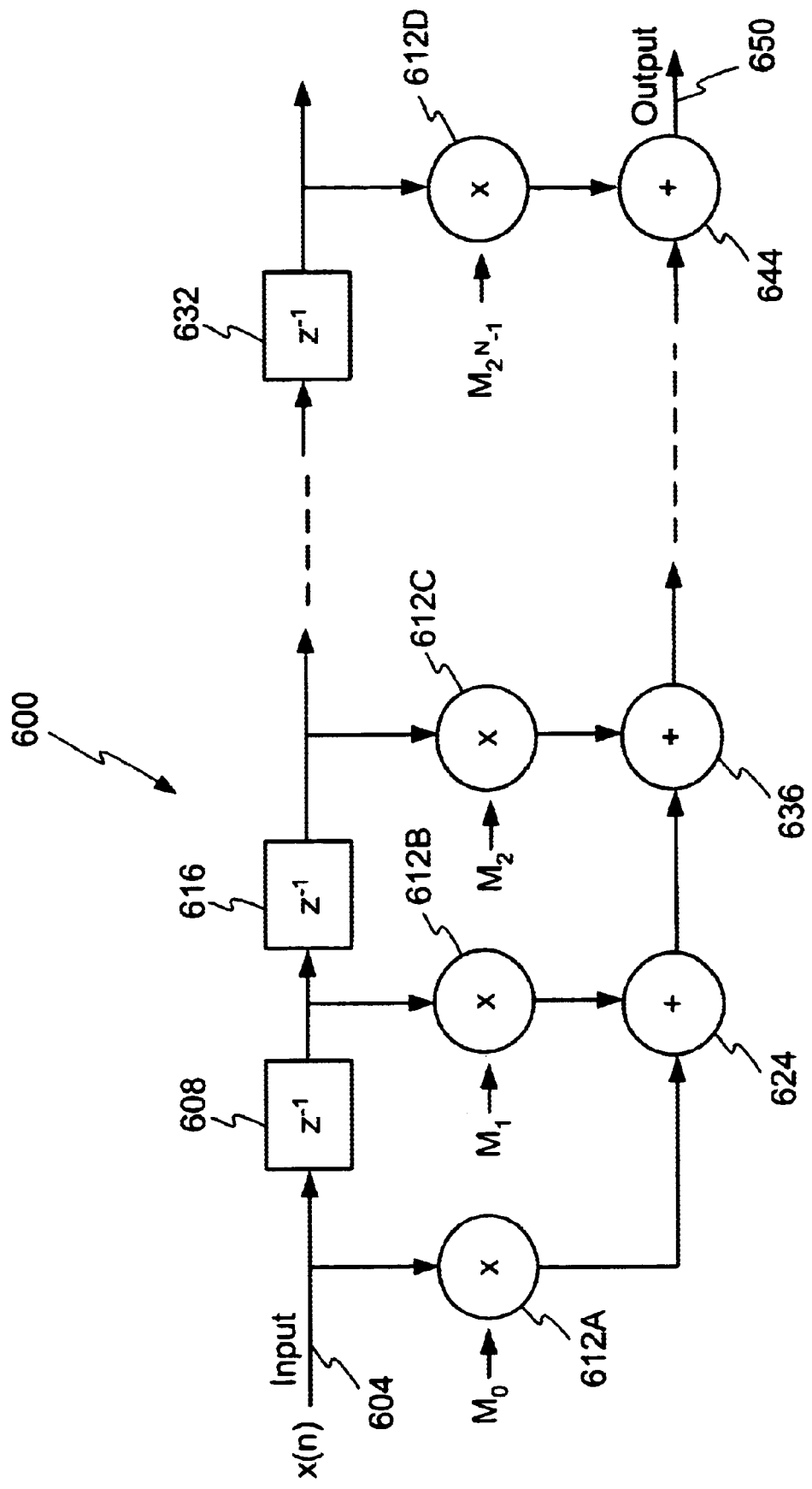
FIG. 6 illustrates an alternative embodiment of a sequence generator comprising a tapped delay line configuration.

FIG. 6 illustrates an alternative embodiment of a sequence generator. The embodiment shown in FIG. 6 comprises a tapped delay line configuration designed to generate a sequence for use with the systems described herein. As shown in FIG. 6, an input 604 connects to a delay register 608 that is configured to receive and delay for a clock cycle or other period the received value. The input 604 also connects to a multiplier 612A having a multiplier value $M_0$. All arithmetic operations in this embodiment may be performed in the traditional fashion, that is, not modulo-2. The output of the multiplier 612A connects to a summing junction 624.

The output of the register 608 connects to multiplier 612B having a multiplier value $M_1$. The output of the multiplier 612B connects to the summing junction 624 to add the output of the multiplier 612B and the multiplier 612A. The output of the register 608 also connects to a register 616, the output of which connects to multiplier 612C. The output of the multiplier 612C connects to summing junction 636, which also receives the output of summing junction 624. The tap delayed line 600 continues in this configuration until connecting to a register 632 that has an output connected to a multiplier 612D with a multiplier factor $M_2^N{}_{-1}$. The output of multiplier 612D connects to a summing junction 644 that also receives the output of the previous summing junction.

This configuration is $2^N-1$ long with the elements of the tapped delay line controlling the sequence generated. Specifically, the coefficients of the tapped delay line are the sample values of the desired sequence signal. An input of a pulse followed by zero-valued samples to the tapped delay line propagates through the tapped delay line and as the pulse propagates through the line, it encounters the multiplier values of the multipliers 612. The multiplier value will propagate to the output since all other coefficients are multiplied by zeros. In one embodiment, the multiplier values may comprise a logical 1 or a logical 0. The multipliers 612 each pass a logical 1 to its associated summing junction or pass a logical 0 to its associated summing junction. Hence, a sequence signal is output with values controlled by the values of the multipliers 612. In a variation of this embodiment, the values of the multipliers may be selected as other than 1's or 0's to thereby generate a mapping as is performed by the mapping module 422 shown in FIG. 4. In such a variation, the mapping module 422 can be eliminated.

Yet another embodiment of the sequence generator comprises a table look-up system. In a table look-up system, a sequence signal is stored in memory or a look-up table and recalled using a software interface. Hence, upon request of a particular sequence signal, the sequence generator 420 performs a table look-up, recalls the desired sequence signal from memory, and provides the sequence to the other systems of the transmit module 400. Any number or variation of sequences signals may be stored or retrieved.

Returning now to FIG. 4, the signal mapper 422 transforms the digital output of the sequence generator to any various signal levels that represent bit values. For example, four bits of digital data may be represented as 16 PAM, i.e. any of 16 different numerical values. The 16 different values may be represented on a scale of minus one to seven eighths in increments of ⅛. The signal may be scaled by an amplifier to yield a desired transmit power. In one embodiment the signal mapper 422 comprises a table look-up device or process that translates the binary input to a numeric output.

The transmit filter 424 is configured to manipulate the output data to adhere to desired or required spectral requirements. For example, frequency filtering may occur to improve system performance by tailoring the frequency content of the output or filtering may be mandated by FCC or a standards organization. It may be desired to attenuate out-of-band energy while also minimally effecting in-band energy. The embodiment shown in FIG. 4 implements spectral shaping with a digital filter. An analog filter may serve to reject images of the digital processing. Another embodiment eliminates any digital transmit filter. In such an embodiment, the spectral shaping is provided by the analog filter.

The digital to analog converter 426 is generally understood to convert a digital signal to an analog signal. In the embodiment shown, the transmission on the line occurs in an analog format.

Although not shown, an analog filter may also be included just prior to the line interface 408 in the transmit module 400 to perform final filtering of the analog waveform to spectrally prepare the signal for transmission over the channel 412. The analog filter may operate similarly to the transmit filter 424 but in the analog domain.

Example Sequences

In one configuration, the sequence generator 420 or other device with similar capabilities generates a sequence defined by varying the polynomial of the sequence generator to provide different sequence signals. In another configuration, the polynomial is selected to maximize the period of the sequence, such as to create an M-sequence. As described above, the period of a length-maximized sequence is defined as $2^m-1$ where m is the number of stages of shift registers used to generate the sequence.

By varying the number of stages m, the period is controlled. Various advantages may be gained by varying the period of the sequence. For example, one advantage of increasing the period of the sequence when used according to the invention for sequence time domain reflectometry is in mitigating the effects of correlated additive noise such as crosstalk. In the correlator, the noise component is decorrelated which spreads the noise across all frequencies thus reducing the amount of noise in the frequency band of interest. This improves the accuracy of the channel analysis. Another advantage of increasing the period of the sequence is that the system can provide a more complete response and longer channels may be analyzed. Yet another advantage of increasing the period of the sequence is that the reflection analysis is based on more tones with finer frequency spacing. Increasing the sequence period does not decrease the temporal resolution of the analysis. The temporal resolution is determined by the duration of one element of the sequence not the total length of the sequence.

An advantage of a shorter period generated by using a smaller m value is that the sequence may be generated and analyzed more rapidly. This speeds the process. Another advantage of shorter period sequences is a lowering of the computational complexity in the receiver.

Although numerous specific sequences are provided below, it is contemplated that any type sequence may be used. The text Introduction to Spread Spectrum Communications written by Peterson, Ziemer and Borth, (Prentice Hall, 1995), which is incorporated herein in its entirety, provides a discussion on different sequences and in particular different types of M-sequences. Table 3-5, from the above-referenced text, provides a list of primitive polynomials that may be used to generate the sequence. Any sequence period may be selected. Other sequence signals that are contemplated for use with the invention, than those listed, also exist.

In general, numerous M-sequences exist with periods depending on the number of stages in the shift register. There is at least one M-sequence for every integer greater than one where this integer represents the number of stages of the shift register. If more than one M-sequence exists for a given number of stages then the sequences are distinguished by the non-zero taps of the shift register. This is designated by the polynomial representation. In one embodiment of the invention, a sequence having a period of 31 is generated by a modem or other communication device, or test equipment, which may be located at any point along a communication channel. One polynomial defined by a period of 31 is:

$$s(n)=s(n-2)\oplus s(n-5)\oplus f(n)$$

where f(n) is the logical ones input to the sequence generator, s(n−k) is the tap point after the k-th delay element in the sequence generator and $\oplus$ is modulo-2 addition.

Another example polynomial that may be generated by a communication terminal and is defined by a period equal to 63 is:

$$s(n)=s(n-1)\oplus s(n-6)\oplus f(n)$$

Another example polynomial that may be generated by a communication terminal and is defined by a period equal to 127 is:

$$s(n)=s(n-3)\oplus s(n-7)\oplus f(n)$$

Another example polynomial that may be generated by a communication terminal and is defined by a period equal to 255 is:

$$s(n)=s(n-2)\oplus s(n-3)\oplus s(n-4)\oplus s(n-8)\oplus f(n)$$

In another embodiment of the invention, a sequence having a period of 31 may be generated by a communication terminal and adopted for use as a sequence signal. One polynomial defined by a period of 31 is:

$$s(n)=s(n-3)\oplus s(n-5)\oplus f(n)$$

where f(n) is the logical ones input to a sequence generator, s(n-k) is the tap point after the k-th delay element in the sequence generator and $\oplus$ is modulo-2 addition.

Another example polynomial that may be generated by a communication terminal and is defined by a period equal to 63 is:

$$s(n)=s(n-5)\oplus s(n-6)\oplus f(n)$$

Another example polynomial that may be generated by a communication terminal and is defined by a period equal to 127 is:

$$s(n)=s(n-4)\oplus s(n-7)\oplus f(n)$$

Another example polynomial that may be generated by a communication terminal and is defined by a period equal to 255 is:

$$s(n)=s(n-4)\oplus s(n-5)\oplus s(n-6)\oplus s(n-8)\oplus f(n)$$

The term communication terminal is defined to mean any configuration of software or hardware configured to facilitate or perform communication or generate a signal or sequence. In another embodiment the term communication terminal is defined to mean a piece of test equipment. This includes a modem, scrambler, sequence generator or other similar device, or a separate, stand-alone device.

Using the sequence signals, generated by the sequence generator, scrambler, or any other device capable of generating a corresponding sequence signal for time domain reflectometry provides advantages over the prior art signal of a single high power pulse. One such advantage comprises the ability to implement the sequence time domain reflectometry in an integrated circuit, such as within a communication device.

Receive Module

The receive module 404 includes the analog to digital converter to transform the received reflection signal from the analog domain to the digital domain. An amplifier (not shown) may be placed between the line interface 408 and the analog to digital converter 440 to amplify the possibly weak reflection signal from the channel 412. In one embodiment, the analog to digital converter 440 comprises a fourteen bit converter. Increasing the precision of the converter improves the dynamic range of the receive allowing smaller magnitude returns to be detected, such as those from a very long transmission line.

The receiver filters 442 comprise standard filters such as high and low pass filters to eliminate unwanted frequency components that are outside of the frequency band of the reflection signal. Any type of digital filtering may be performed by the filters 442. In addition, analog filters (not shown) may be located prior to the analog to digital converter 440 as necessary to filter the reflection signals received from the line interface 408 prior to conversion into the digital domain.

The sequence correlator 446, which receives the output of the receiver filters 442, comprises a configuration of hardware, software, or combination thereof, that is configured to correlate the reflection sequence signal with a copy or duplicate of an original sequence signal that was generated by the sequence generator 420. Although not shown, the sequence correlator 446 may communicate or connect to the sequence generator 420. In one embodiment, the correlation comprises cross correlation. Mathematically, in one embodiment, a crosscorrelator is realizing the following function:

$$h(n) = \sum_k C(k)X(k+n)$$

where X(n) is the sum of the transmitted sequence C(n) plus any additive noise and crosstalk. In one embodiment the correlator 446 is embodied using a sliding tapped delay line. There are numerous ways to implement the correlator 446 and this is but one example embodiment. The correlator 446 may be embodied in hardware, or software, or a combination of the two. Indeed, it is contemplated that an analog implementation of the correlator maybe preferred particularly in high rate applications. In this implementation analog to digital converter 440 maybe omitted. In the sliding tapped delay line method the taps are C(n).

Figure 7:
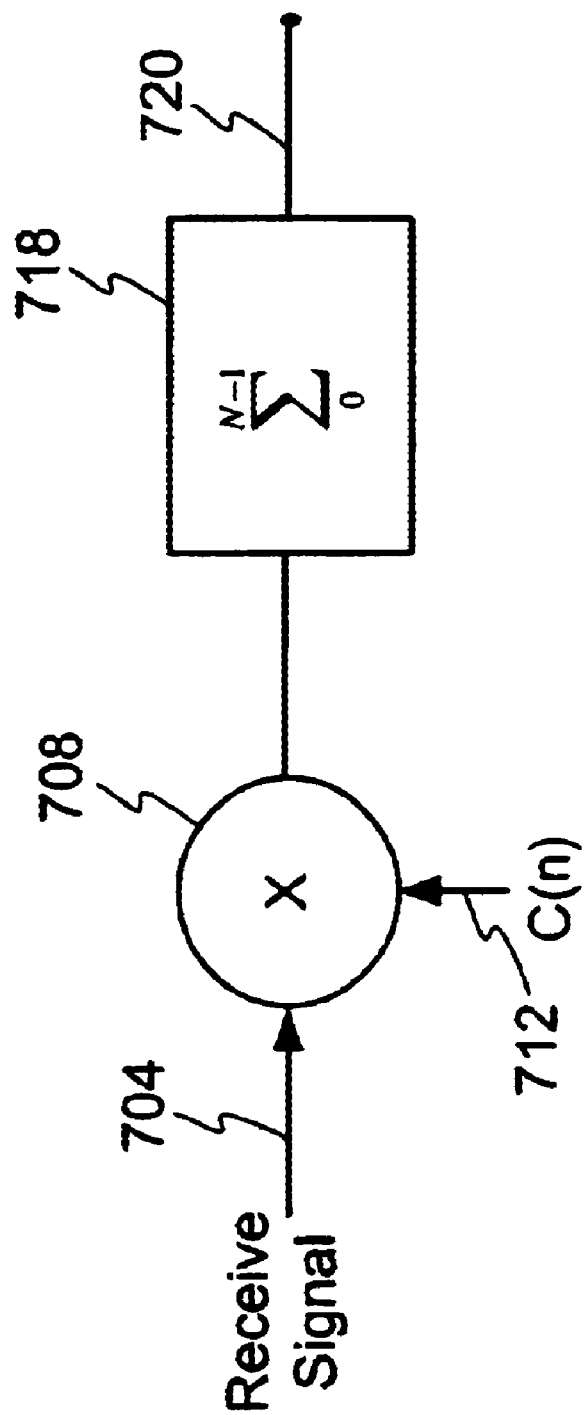
FIG. 7 illustrates block diagram of an example configuration of a correlation unit.

One example embodiment of a cross correlation device is shown in FIG. 7. FIG. 7 illustrates block diagram of a correlation unit configured to correlate a received signal with a signal C(n). An input 704 connects to a multiplier 708. A second input 712 provides a second signal to the multiplier 708. The output of the correlator connects to a summing junction 718, which has an output 720.

The received reflection signal is provided on input 704 to the multiplier unit 708 while a sequence signal C(n), that is generally identical to the sequence signal transmitted on the channel, is provided on the second input 712. These sequence signals are multiplied together on a value by value basis over time. The output of the multiplier 708 is summed, over time, in the summing junction 718 and provided on the output 720. The correlation system provides an output signal with a peak at the point when the signals align, i.e. correlate. A noticeable peak at the point of correlation indicates a sequence with good correlation properties.

The accumulator or summing junction 718 comprises a device configured to generate a running summation of the received signals. In general, the output of the summing junction 718 is generally similar to a first order approximation of an integral over the period of time that the system operates. Thus, the summing junction 718, upon receipt of a number, stores the number. Then, upon receipt of another number, the summing junction 718 adds the first number to the second number and stores the result. The process continues in this manner. In one embodiment, the summing junction 718 comprises one or more registers to store the accumulating result. The output of the correlation process is an estimate of the impulse response of the channel. This is a time domain signal.

Another example embodiment of the cross correlation is based on frequency domain processing. The cross correlation can be implemented in the frequency domain by multiplying together the frequency domain representation of the received signal and the reference signal. The reference signal may be the discrete Fourier transform (DFT) of the transmit sequence, inverted in time. When periodic sequences are used, the frequency domain representation can be constructed by using a DFT of the same length as the period of the signal. If the receive signal consists of multiple periods, then the noise characteristics of the correlated signal can be improved by appropriately summing up multiple periods, either before or after taking the DFT of the received signal. For non-periodic signals or signals with long periods, it may be appropriate to compute the cross correlation in the frequency domain using the overlap-add or overlap-save methods. If the cross correlation is computed in the frequency domain, it may be appropriate to convert it back to the time domain for further time domain processing.

Returning to FIG. 4, as a result of correlating the reflection signal with the sequence signal as originally transmitted on the channel 412, the output of the correlator 446 provides a signal that may generally resembles the plot shown in FIG. 2B, although unwanted components may be present. When an echo signal is aligned with the sequence signal in the correlator, a peak occurs at the output. In this manner, the output of the correlator provides an indication of when the received signal contains an echo or point of reflection. These points correspond to anomalies in the line.

Advantages Regarding Noise

Another advantage of the correlation processing that occurs from use of a sequence signal having good correlation properties is with regard to noise. The invention sends a plurality of bits in the form of a sequence signal and then monitors for the received reflection signal, which is also a plurality of reflected bits in the form sequence signal. Each anomaly generates a sequence of reflections. As a result of the spreading of the signal over a plurality of bits in the sequence, the received noise, such as random noise from static, interference or crosstalk, is spread over the length of the reflection sequence.

Figure 8A:
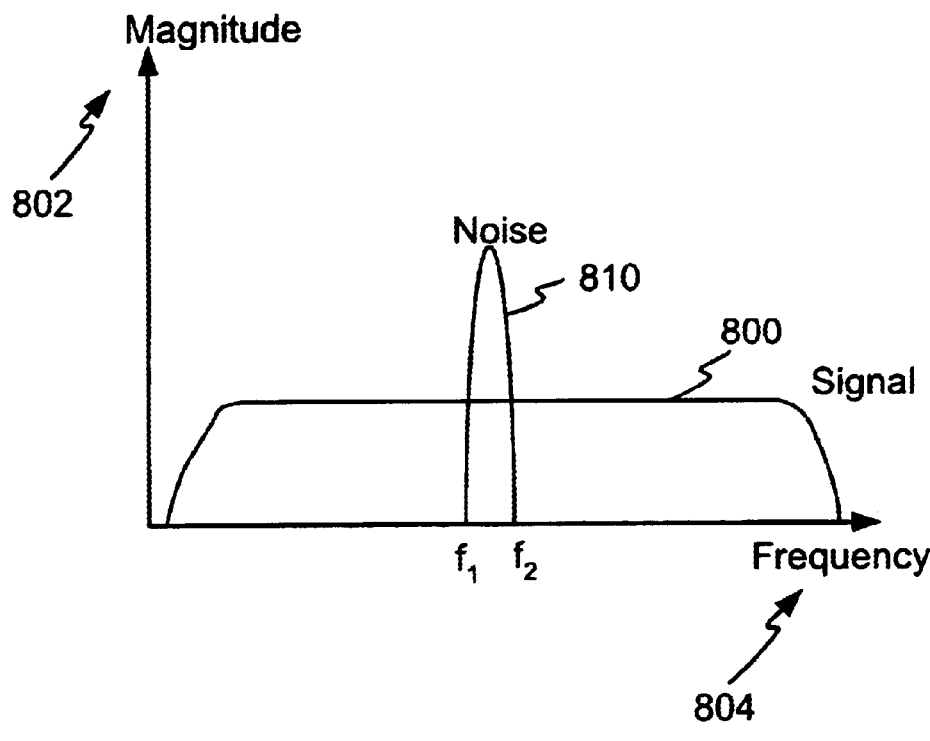
FIGS. 8A and 8B illustrate example plots of a sequence signal and associated noise before and after the correlation operation.
Figure 8B:
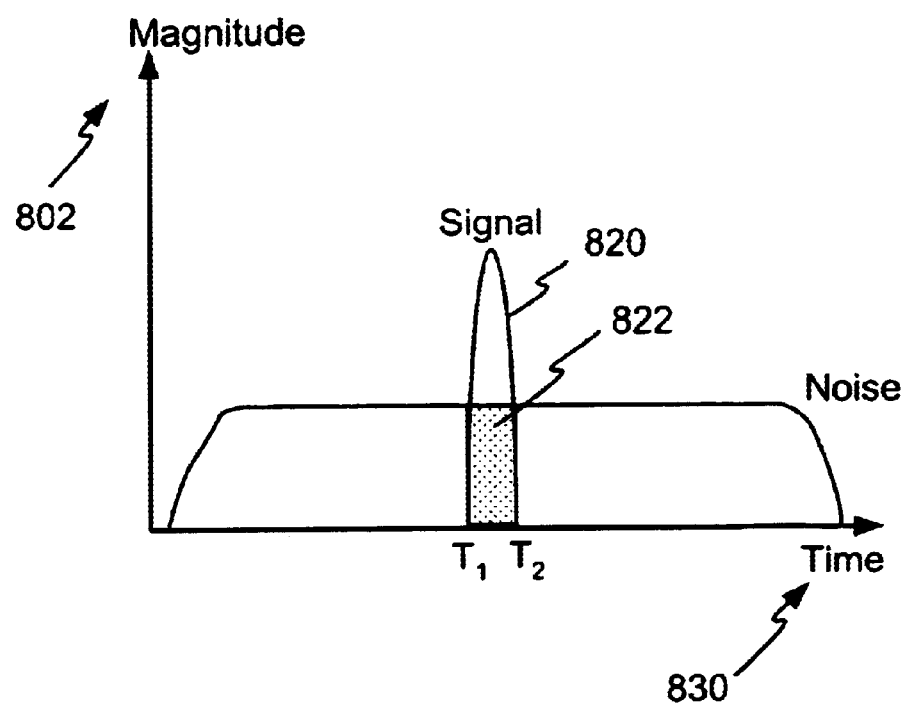

FIGS. 8A and 8B, which illustrates example plots of a sequence signal and the effect of correlation, are helpful in describing the advantages gained by the invention with regard to noise. FIG. 8A illustrates a plot of a sequence signal 800 in relation to a vertical axis 802 representing magnitude and a horizontal axis 804 representing frequency. An undesirable noise component 810 resides between frequencies $f_1$ and $f_2$. If a single pulse signal is transmitted, the noise that will be received with the reflection signal will disrupt analysis.

In reference to FIG. 8B showing a plot of the correlated signal 820 and the noise 822 that is part of the correlated signal after correlation in relation to magnitude on the vertical axis 802 and time on the horizontal axis 830. During the correlation process, the original sequence and the reflection sequence only correlate at the point of alignment, that is between times $T_1$ and $T_2$. Thus, noise on the reflection signal is disbursed over the time period of the correlation process. Correlation serves as a summation only at the point of correlation thereby reducing the effects of the noise. Hence, noise is a smaller portion 822 of the correlated signal because the noise is spread. Thus, the invention reduces the effect of noise on the line.

Another advantage of the invention is that it allows for the transmission of a lower power signal over the channel. Use of a low power signal eliminates interference, such as from crosstalk, with other adjacent lines, such as other pairs in the binder. Use of a low power signal provides the further advantage of enablement using an integrated circuit, such as built into a modem. This eliminates the requirement for the sequence time domain reflectometry system to be built into a separate piece of test equipment that is constructed to enable generation and transmission of a high power pulse.

It is contemplated that the power level of the sequence may be of any magnitude. In one embodiment the power level may be constrained by applicable standards such as the ITU G.shdsl or ANSI HDSL2 standards. This may be implemented by use of transmit filtering which conforms to the power spectral density constraints imposed by those standards. Since the sequence signal may be a valid data signal, it may conform to the standard specifications if the same transmit filtering is employed. This is not true in general for single pulse systems, which use an undesirable high power pulse.

In one embodiment the peak voltage of the sequence signal is less than 6 volts. In another embodiment, the peak voltage of the sequence signal is between 6 volts and 18 volts. In yet another embodiment, the peak voltage of the sequence signal is higher than 18 volts. This are but example ranges. Any peak voltage or power level may be selected.

Returning to FIG. 4, the calibration and artifact reduction module 448 may comprise software or hardware configured to manipulate or eliminate portions of the reflection signal. In one embodiment, the calibration and artifact reduction module reduces correlation artifacts. In one embodiment the calibration and artifact reduction module 448 comprises an interface to memory configured to recall one or more different signals or template signals. The signals or templates may comprise stored, calculated, recorded, or estimated behavior of one or more components or interfaces in the system in relation to a sequence signal. By subtracting the stored, calculated, recorded, or estimated behavior from the received reflection signal, unwanted or undesired portions of the reflection signal may be eliminated or reduced. This process is referred to herein as calibration. The template, to be subtracted from the received reflection sequences to thereby modify the reflection sequences, may be stored in memory, generated, or obtained by manipulation of stored data to obtain the desired signal. In one embodiment, the stored template is already correlated. In another embodiment, the stored template is not correlated until after being recalled from memory.

In one embodiment, the configuration of the line interface 408 may be such as to create a reflection such as near-end echo. Because the line interface 408 is close to the transmitter and receiver, the resulting near-end echo will have a large magnitude in relation to the reflection created from distant line anomalies. Such a disproportional signal may disrupt analysis of the reflections at issue and hence it may be desirable to reduce or eliminate this signal.

In one particular embodiment, the calibration and artifact reduction module 448 is configured to eliminate the reflection created by the line interface 408. In such an embodiment, one or more sample reflection signals, also referred to as templates, are stored in memory or means provided to generate or recall these template signals. After execution of the channel analysis and a reflection signal being received by the calibration and artifact reduction module 448, the module 448 recalls the template from memory or generates the template and subtracts the template from the received reflection signal.

This removes or reduces the effects of the line interface to thus provide greater accuracy during subsequent processing. Prior to subtraction, the template is properly aligned with the reflection signal.

The analysis module 450 receives the signal from the calibration and artifact reduction module 448. In one embodiment, the analysis module 450 is embodied in software, stored on computer readable media and configured for execution by a processor or other software execution device. In one embodiment, the analysis comprises synchronization of the reflection signal to a time of transmission over the line. Based on the synchronization, the time between the start of the transmission and the receipt of each reflection peak can be calculated. Timers, a timing module, or counters in conjunction with peak detectors may be used to determine the time between sequence transmission and peak detection. The following equation may be used to calculate the distance to the line anomaly from the line interface. Assuming a rate of propagation of about ⅔λ for twisted pair, where λ is the speed of light in units/second, then:

$$\text{distance(units)} = \left(\frac{2}{3}\lambda\right)\frac{\times \text{time\_until\_reflection\_peak}}{2}$$

This accurately provides the distance to the anomaly and thus allows service technicians to quickly locate and remedy or remove the anomaly. Various different mediums have different rates of propagation. In addition, the number and severity of the effect of the anomalies may be determined and a decision made regarding whether to repair or abandon the line. Of course, this is but one possible method of analysis.

Figure 9:
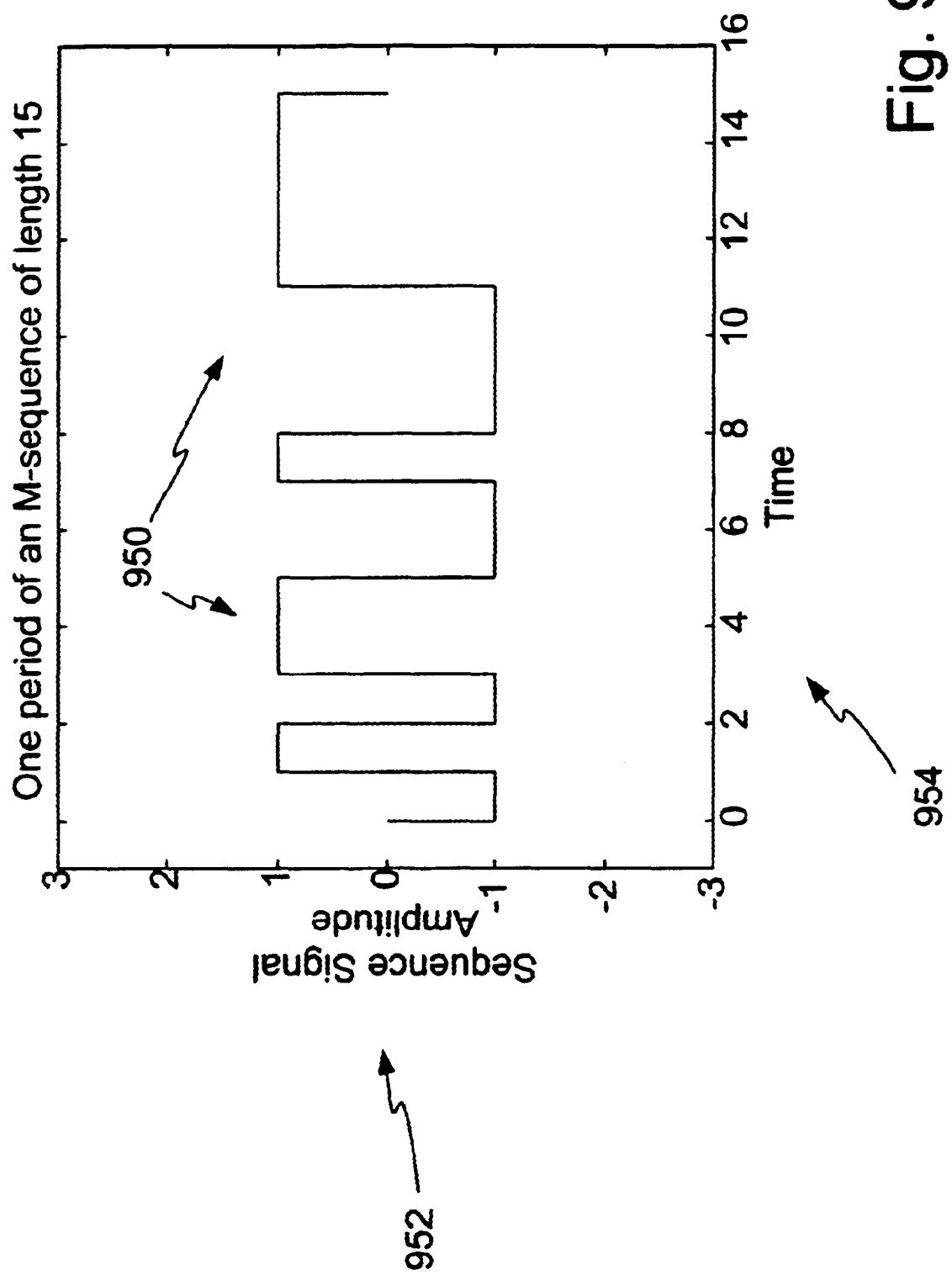
FIG. 9 illustrates a plot of an example sequence signal.

FIG. 9 illustrates a plot of an example sequence signal 950. Signal amplitude 952 is represented on the vertical axis and time 954 is represented on the horizontal axis. The example sequence is provided for purposes of discussion only. Other sequences are contemplated.

Figure 10:
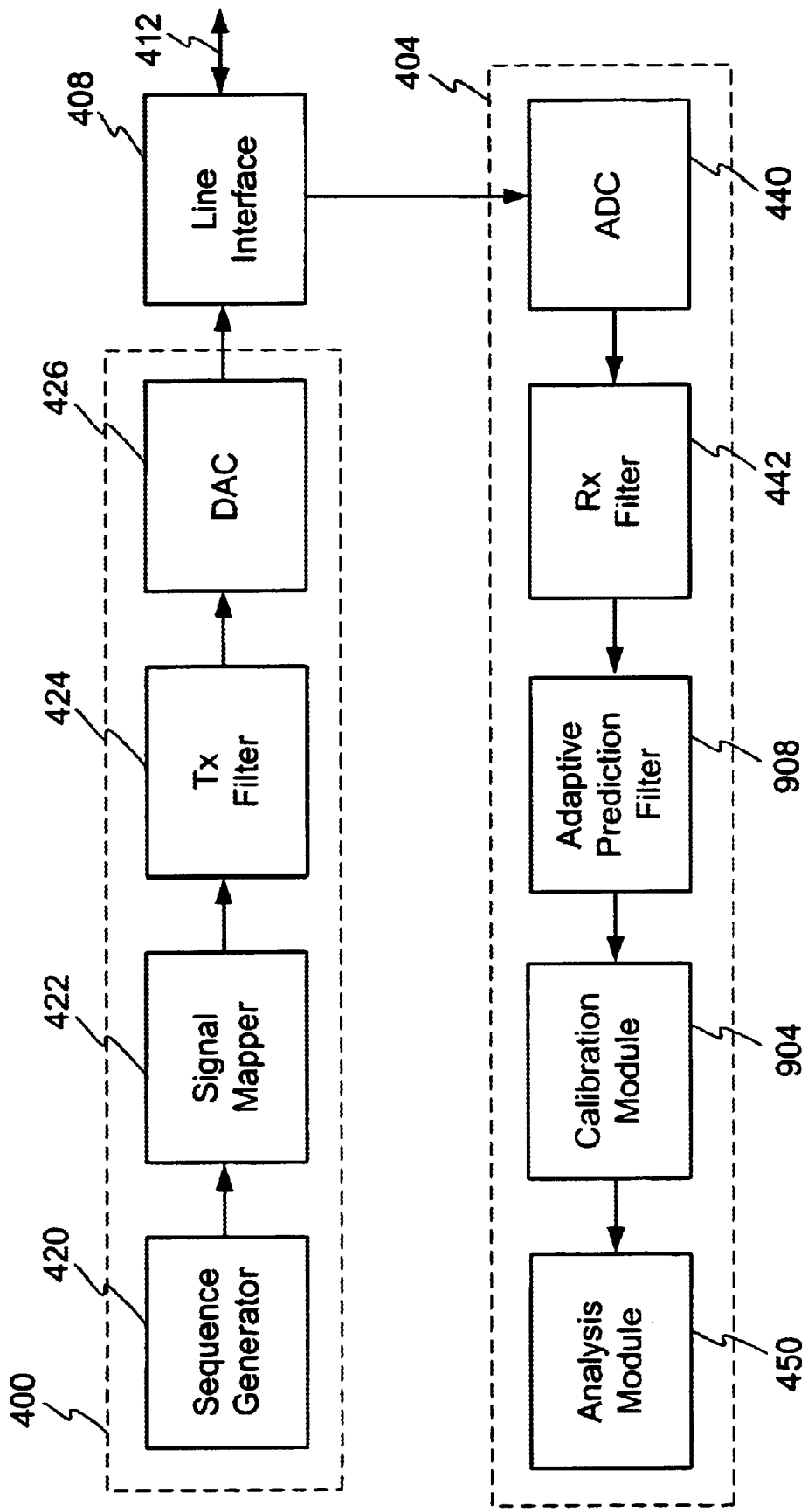
FIG. 10 illustrates an alternative embodiment of the invention.

FIG. 10 illustrates an alternative embodiment of the invention. As compared to FIG. 4, similar elements are identified with identical reference numerals. As shown, output from the receiver filters 442 connects to an adaptive prediction filter 908. The output of the filter 908 connects to a calibration module 904, which in turn has an output connected to the analysis module 450. The adaptive prediction filter 908 may comprises any type system configured to generate coefficients or other representative signals or values that portray the reflection response of the channel 412. The adaptive prediction filter 908 compares a reflection received from the channel to its own output and dynamically adjusts its internal coefficients or values to generate a signal that is generally identical to the reflection channel. This may occur via the use a feedback link. The internal coefficients or values of the adaptive prediction filter thus define the channel and can be analyzed to determine the location of anomalies in or on the line.

Figure 11:
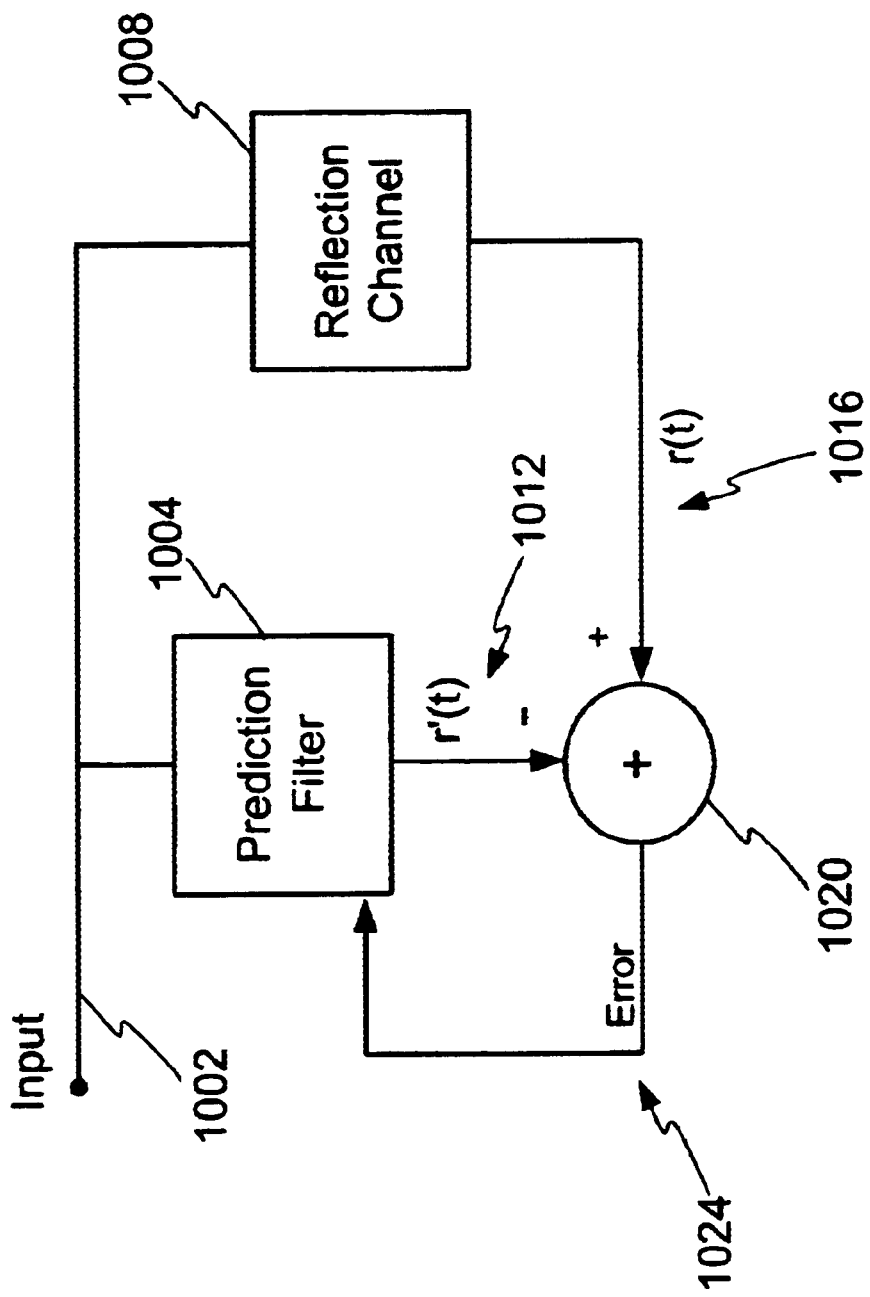
FIG. 11 illustrates a block diagram of an example configuration of a prediction filter configured to match the channel response.

FIG. 11 illustrates a block diagram of a representative configuration of a prediction filter configured to match the channel response. An input 1002 connects to the prediction filter 1004 and to the channel 1008. The reflection output of the channel 1008 is represented by the reflection signal r(t) 1016. The output of the prediction filter 1004 comprises an adapted signal r'(t) 1012 and feeds into a summing junction 1020 as a negative input. The reflection signal r(t) 1016 also connects to the summing junction 1020. Thus, the predictive filter output r'(t) 1012 is subtracted from the reflection signal r(t) 1016. The resulting output of the summing junction 1020 comprises an error signal 1024 representing the difference between the prediction filter output 1012 and the actual reflection signal 1016. The error signal 1024 feeds back into the prediction filter 1004. If the error signal is not zero or about zero, the prediction filter 1004 adjusts its coefficients or internal values to force the error signal 1024 to zero. When the error signal 1024 is zero or about zero, then the coefficients or values of the prediction filter represent the reflection channel. The sequence defined by the filter coefficients is an estimate of the impulse response of the echo channel, which is comprised of the near-end echo path and the transmission paths to and from each anomaly, which causes a reflection. Thus, it is an estimate of the correlated sequence signal and the same processing analysis can be employed that was applied in the embodiment of FIG. 4.

One example embodiment of an adaptive predictive response filter comprises a tapped delay line configuration as shown in FIG. 6. The multiplier values M are the values of interest in the prediction filter 1012. This may be implemented as a finite impulse response filter. The Electronic Handbook, edited by Jerry C. Whitaker from CRC Press, Inc., 1996, which is incorporated in its entirety herein, contains a discussion of digital and adaptive filters at page 749–772. It is contemplated that a direct form structure or a module form structure may be used.

Although the tapped delay line type system is described, it is contemplated that any echo cancellation type system may be adopted for use. Any system configured to generate a signal that is generally the same as a reflection signal received over the channel in response to the sending of a sequence signal may provide the necessary information to perform time domain reflectometry analysis of the channel. Once the system is configured in this manner, a single impulse followed by zeros applied at the input of the prediction filter will produce the impulse response of the reflection channel at the output of the prediction filter. It may be desirable to supply the utilized coefficient values of the prediction filter instead of inputting a pulse followed by zeros.

Operation

Figure 12:
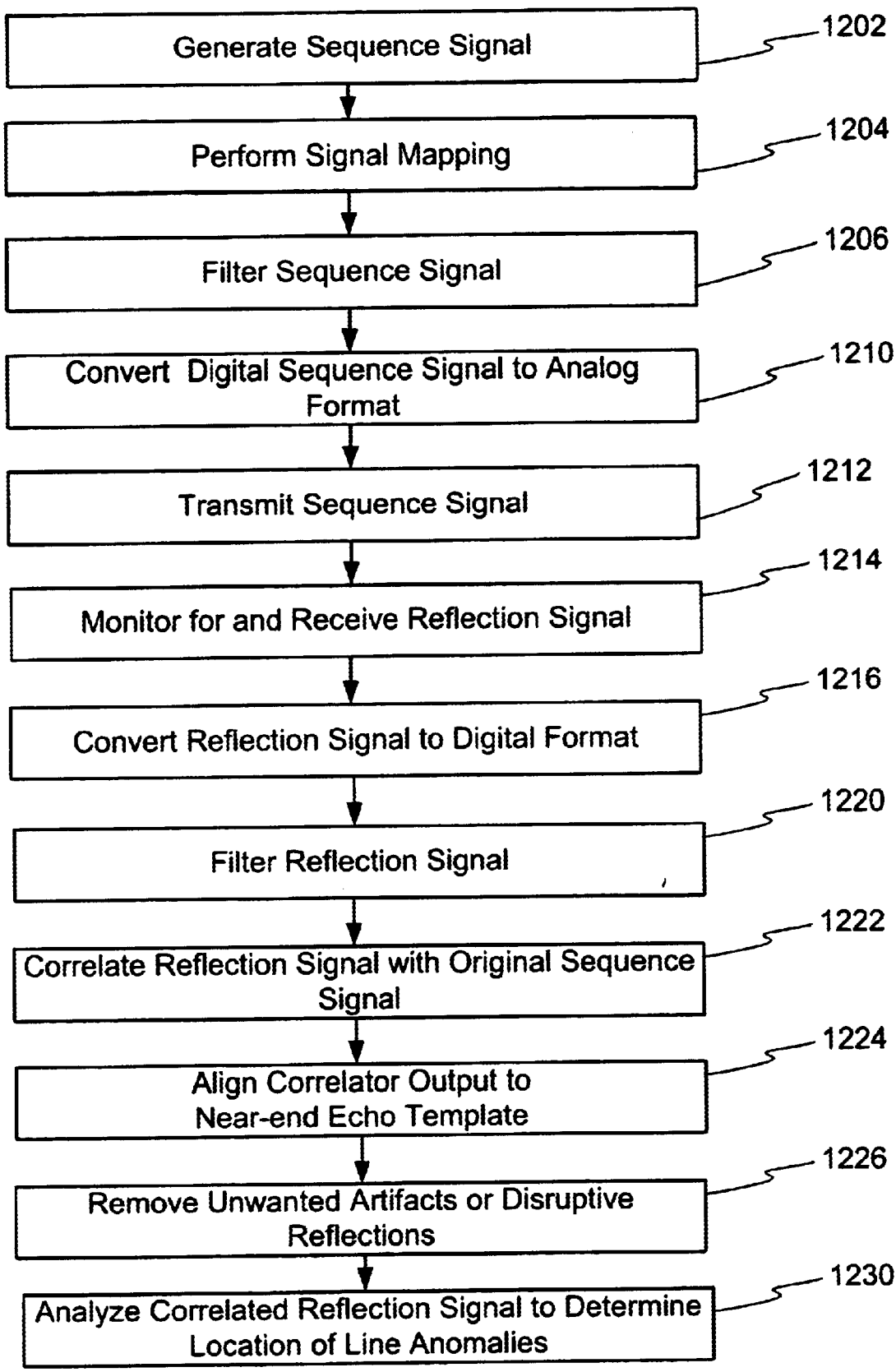
FIG. 12 illustrates an example method of operation of one embodiment of the invention.

FIG. 12 illustrates an example method of operation of one embodiment of the invention. This is but one example embodiment. It is contemplated that other methods of operation are possible and within the scope of the invention as define by the claims. At a step 1202, the sequence time domain reflectometry system (hereinafter system) generates a sequence signal. The sequence signal may comprise an M-sequence or any other type of sequence. In one embodiment, the sequence comprises a sequence with good autocorrelation properties. At a step 1204, the operation performs signal mapping to assign the sequence signal to one of several different values. At a step 1206, the system filters the signal to remove unwanted components. At a step 1210, the system converts the digital sequence signal to an analog format. At a step 1212, the system transmits the sequence signal over a communication channel. It is understood that transmission of a signal over a channel will generate reflections at points of impedance mismatch i.e., line anomalies.

At a step 1214 the system monitors for and receives any reflection signals generated by the transmission of step 1212. The reflection signal may be defined as the overall signal(s) received during a period of time after the transmission of the original sequence signal over the channel. Thus, the reflection signal may actually comprise several periods of silence and several individual echoes created by the sequence signal encountering impedance mismatches or other anomalies as it travels down the channel. During receipt, the reflection is converted to a digital format at a step 1216. The signal may be stored or processing may continue at step 1220 by filtering the reflection signal to remove signals at unwanted frequencies. At step 1222, the system correlates the reflection signal with the original sequence signal. The correlation reveals the location of peaks within the reflection signal. Considered in different terminology, the channel is monitored after the transmission of the sequence signal for a period of time sufficient for any reflections generated by the transmission to be recorded by the monitoring. The received signals during this period of time are converted to the digital domain and stored or processed. Correlation occurs at step 1220 between the original sequence signal and any signals recorded during the monitoring period of step 1214. Peaks in the correlated signal occur at the points of time in the received signal when a reflection was received.

At a step 1224, the system synchronizes in time the correlator output with the start of the sequence. This allows for an identification of a time, in relation to the start of the sequence signal transmission or other reference point, at which peaks or reflections occur. The peak of the near-end echo may serve as the reference time point. At a step 1226, the system removes unwanted artifacts or disruptive reflections. One example of a disruptive artifact is near-end echo created by hybrid. Thereafter, at a step 1230, the system analyzes the correlated reflection signal to determine the location of line anomalies. This may occur by processing the reflection signal to determine the time difference between the start of the sequence signal transmission and the peak in the correlator of the reflection signal. The time difference is multiplied by the rate of propagation of the signal through the channel. This provides the combined distance to and from the line anomaly using the transmitter or line interface as a reference point. The distance value may be divided by two to arrive at a distance to the anomaly.

Figure 13:
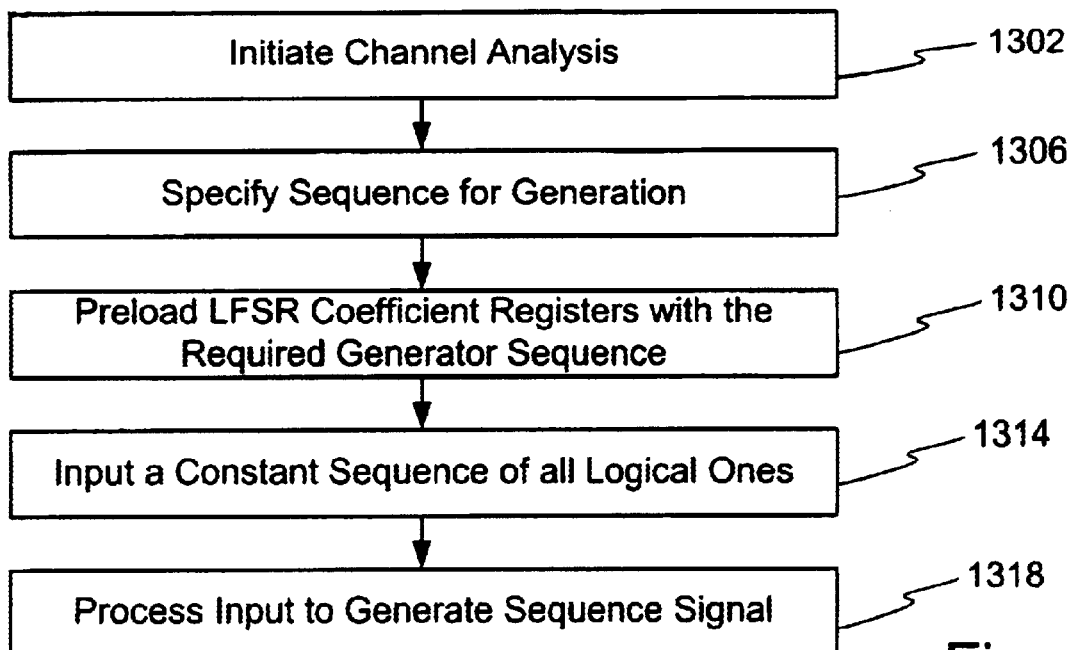
FIG. 13 illustrates an example method of sequence generation.

FIG. 13 illustrates an example method of sequence generation. Numerous different methods of sequence generation are possible. The embodiment shown in FIG. 13 comprises generation by use of a linear feedback shift register (LFSR). At a step 1302, the sequence generation operation initiates the channel analysis process. Next, at step 1306, a specific sequence is designated for use. One characteristic of a specified sequence is its period. At step 1310, the operation preloads registers of the linear feedback shift register with values necessary to realize the specified sequence. At a step 1314, the operation begins inputting a constant sequence of logical 1's into the sequence generator. Thereafter, at a step 1318, the operation processes the series of logical 1's through the sequence generator to create the specified sequence signal.

Figure 14:
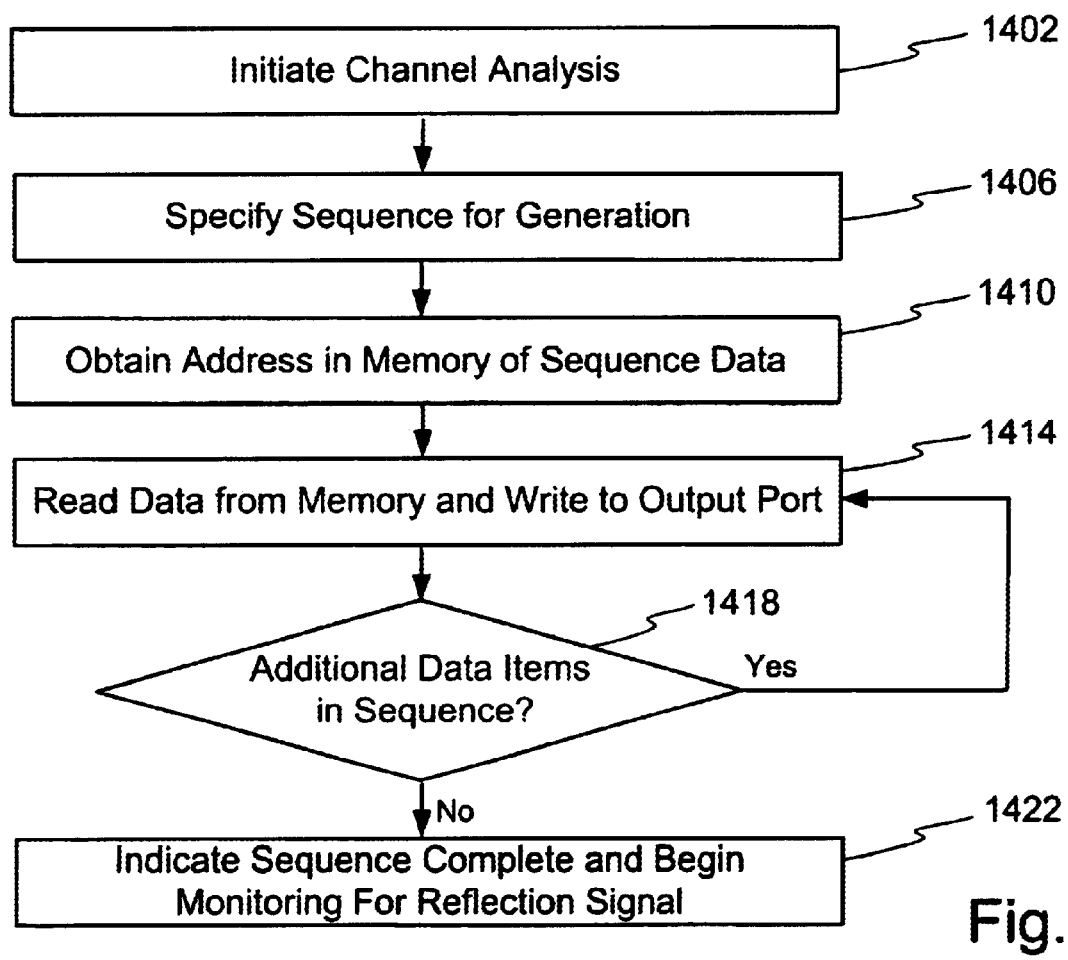
FIG. 14 illustrates an alternative method of sequence generation for use with a table look-up method.

FIG. 14 illustrates an alternative method of sequence generation such as might be implemented for use with a table look-up method. At a step 1402, the channel analysis process is initiated. Thereafter at a step 1406, the operation specifies a sequence for generation. Once the desired sequence is specified at a step 1410, the system obtains or is provided a memory address for the sequence data. Once the location in memory or the look-up table is provided or obtained, the system begins outputting the data items of the sequence. This occurs at step 1414. The operation then progresses to a step 1418 where the system queries to determine if there are additional data items remaining in the sequence. If additional data items exist, then the operation returns to step 1414 and an additional data item is output. If at step 1418 there are no more additional data items in the sequence to be output, then the operation progresses to a step 1422 to indicate that the sequence is complete and that the receiver aspects of the sequence time domain reflectometry should begin monitoring for reflection signals.

It should be noted that in the methods of FIGS. 13 and 14, the sequence may be generated and transmitted once, generated numerous times and sequentially transmitted numerous times, or generated at transmitted in some pattern with a period of silence between one or more sequence transmissions.

Figure 15:
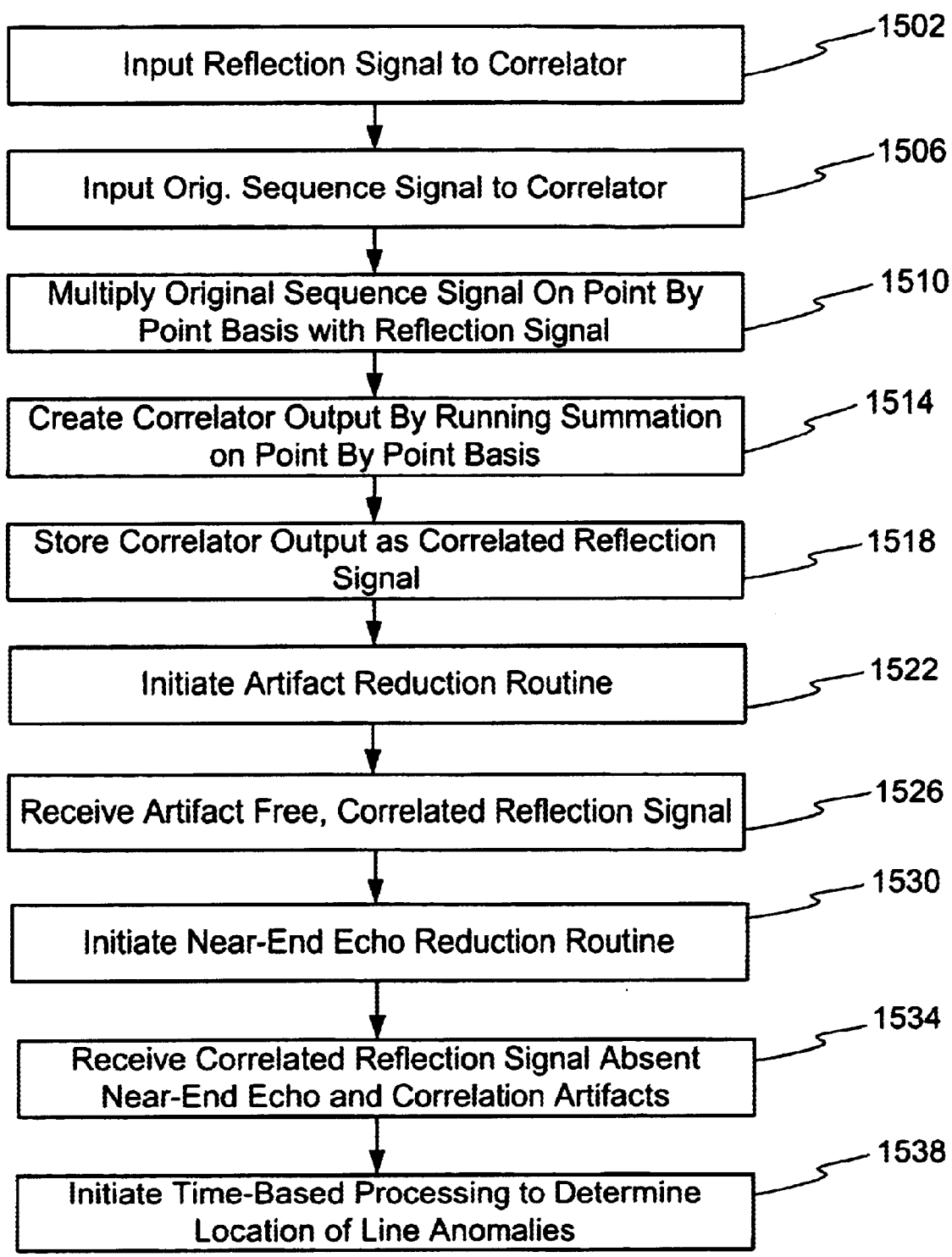
FIG. 15 illustrates an operational flow diagram of an example method of correlation and processing of reflection signals.

FIG. 15 illustrates an operational flow diagram of an example method of correlation and processing of a reflection signal. At a step 1502, the reflection signal is provided to the correlator. In addition, at a step 1506, the operation also provides the original sequence signal to the correlator. In one embodiment, this comprises loading the coefficients of the generator polynomial of the original sequence as coefficients in a scrambler to generate the same sequence as was originally transmitted over the channel. Next, at step 1510 the correlator multiplies the original sequence, on a point-by-point basis with the reflection signal. At step 1514, a correlator creates a running summation of the results of the multiplication of a step 1510. Next, at a step 1518, the operation stores the correlator output as the correlated reflection signal.

Next, at a step 1522, the system initiates an artifact reduction routine. The artifact reduction routing is discussed below in greater detail in conjunction with FIG. 16. After artifact reduction, the system, at a step 1526, receives an artifact free, correlated reflection signal.

Figure 17:
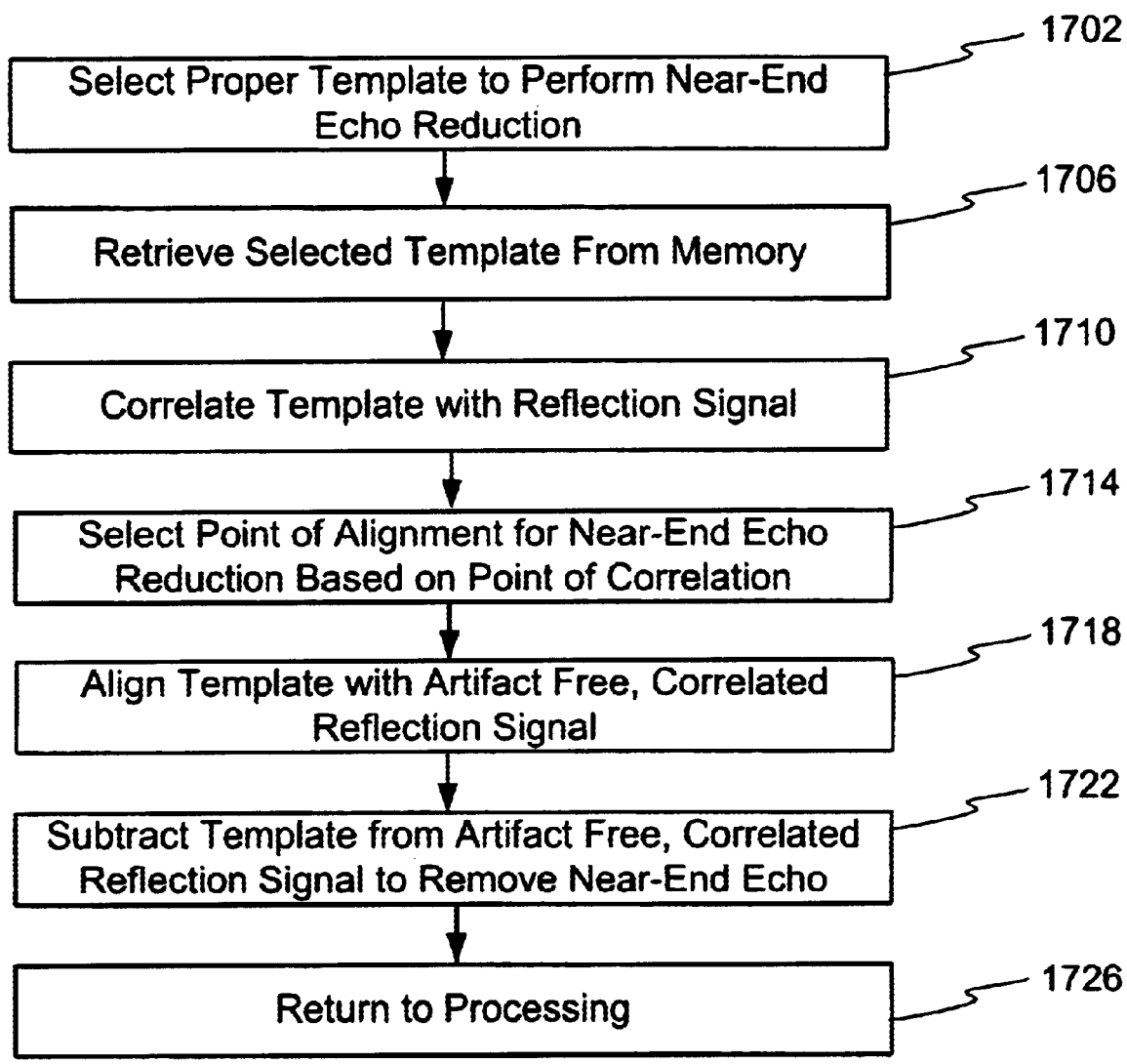
FIG. 17 illustrates an operation flow diagram of an example method of near-end echo reduction.

At a step 1530, the system initiates a near-end echo reduction routine. FIG. 17 provides an operational flow diagram of an example method of near-end echo reduction. After near-end echo reduction, the system receives a correlated reflection signal generally absent of near-end echo and generally without correlation artifacts. This occurs at a step 1534. At a step 1538, the operation initiates a time based processing to determine the location of line anomalies. This process is described in greater detail below in conjunction with FIG. 18.

Figure 16:
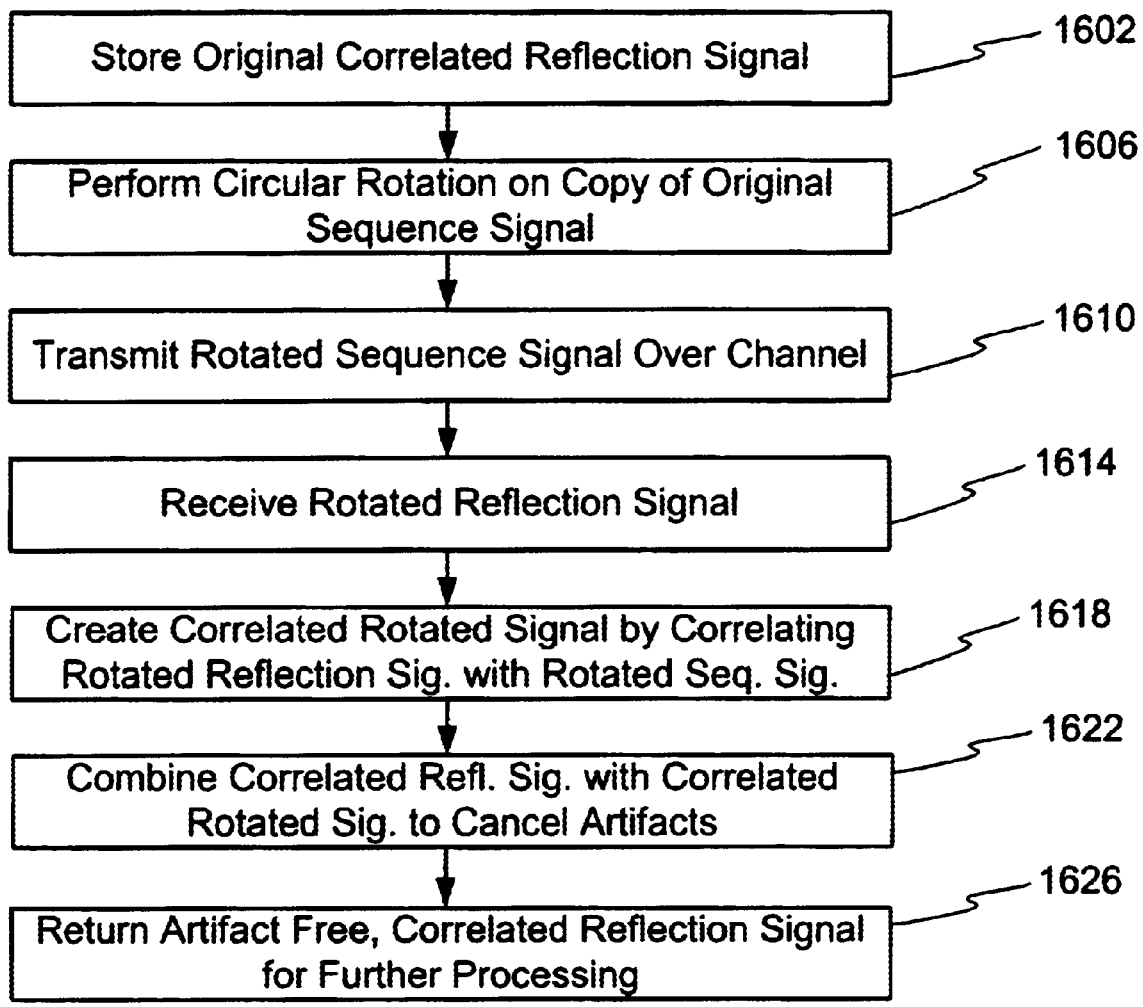
FIG. 16 illustrates an operational flow diagram of an exemplary method of artifact reduction.

FIG. 16 illustrates an operational flow diagram of an exemplary method of artifact reduction. The term artifact as used herein is defined to mean unwanted signal components that are generated by the correlation of the original sequence signal and the reflection signal(s). In one embodiment, a continuous stream of repeating sequences is not sent. In such an embodiment, one or more sequences are sent, followed by a period of silence. Correlation of a non-continuous stream of sequences may lead to partial correlations and thereby generate artifacts before and after the peaks generated at the point of correlation. These artifacts may be referred to as side lobes. The goal of artifact reduction is to remove or reduce the artifacts to thereby more clearly define points of correlation.

In one embodiment shown in FIG. 16, at a step 1602, the operation stores an original correlated reflection signal. This signal will be used in subsequent processing. Next, at a step 1606, the artifact reduction module performs circular rotation on a copy of the original sequence signal. Circular rotation comprises shifting of the values of the sequence by a shift constant k. The shift constant k determines the number of elements the sequences is rotated. By way of example, a shift constant of two shifts the original sequences defined by:

$$\{M_0, M_1, M_2, M_3, M_4, M_5 \ldots M_2^N{}_{-2}\}$$

becomes:

$$\{M_2^N{}_{-3}, M_2^N{}_{-2}, M_0, M_1, M_2, M_3, M_4, M_5 \ldots \}$$

after a circular shift with a shift constant k=2.

Next, at a step 1610, the system transmits the rotated sequence signal over the channel and the system monitors for a reflection signal. At step 1614, the system receives the rotated reflection signal that results from the transmission of the rotated sequence signal. After receiving and processing by the receiver, at a step 1618, the received rotated sequence signal is correlated with the rotated sequence signal. The rotated sequence signal is the signal that was transmitted to create the rotated reflection.

After this correlation, there exists a correlated rotated signal created from the transmission of the rotated sequence signal, receipt of a rotated reflection, and correlation of the rotated reflection with the rotated sequence signal. There also exists the original correlated reflection signal created by the transmission of the sequence signal, receipt of its reflection, and correlation of the reflection with the sequence signal. At step 1622 these two signals, the correlated reflection signal and the correlated rotated signal are combined causing the unwanted artifacts to generally cancel out. In some instances not all artifacts will cancel, but will be significantly reduced. This process may be repeated as needed using different shift constants to further reduce the artifacts. As a result, peaks representing the reflection created by a line anomaly are more clearly noticed and detectable. At a step 1626, the operation returns an artifact free, correlated reflection signal for further processing.

FIG. 17 illustrates an operational flow diagram of an example method of near-end echo reduction. One common source of near-end echo is the line interface, such as a is hybrid. In many instances, the near-end echo created by the line interface is of a greater power level than other reflections caused by distance line anomalies. As a result, the high power near-end echo may mask or drown out the weaker reflections from more distance anomalies. Thus, it may be desirable to perform near-end echo reduction or removal.

At a step 1702, a near-end echo reduction module selects a template for the near-end reduction processes. At step 1706, the template is retrieved from memory. The term template as used herein is defined to mean stored data that corresponds or relates to the behavior of the line interface or other source of undesirably large echo. In one embodiment, one or more templates that correspond to the behavior of different hybrids are stored in memory for recall. In another embodiment, the near-end echo reduction module transmits an example sequence, and monitors the hybrid response and stores this response as the template. The template, as stored, may be correlated or uncorrelated.

At a step 1710, the system correlates the template signal that is recalled from memory with the reflection signal. Correlating these two signals creates a peak at the point where the two signals align. Thus, at step 1714, the operation selects the point in time when the two signals correlate. Using the point in time identified as the point when the two signals correlate, the operation moves to a step 1718 and aligns the template signal with the correlated reflection signal. At a step 1722, the template is subtracted from the correlated reflection signal to remove the near-end echo. Thereafter, at step 1726, the operation returns to processing as referenced in FIG. 15. This removes the near-end echo. It is contemplated that in other embodiments templates other than those corresponding to the reflection from the line interface may be stored and subtracted from the reflection signal. Thus, if other aspects of the reflection signal are to be removed or reduced, the method of FIG. 17 may be utilized.

Figure 18:
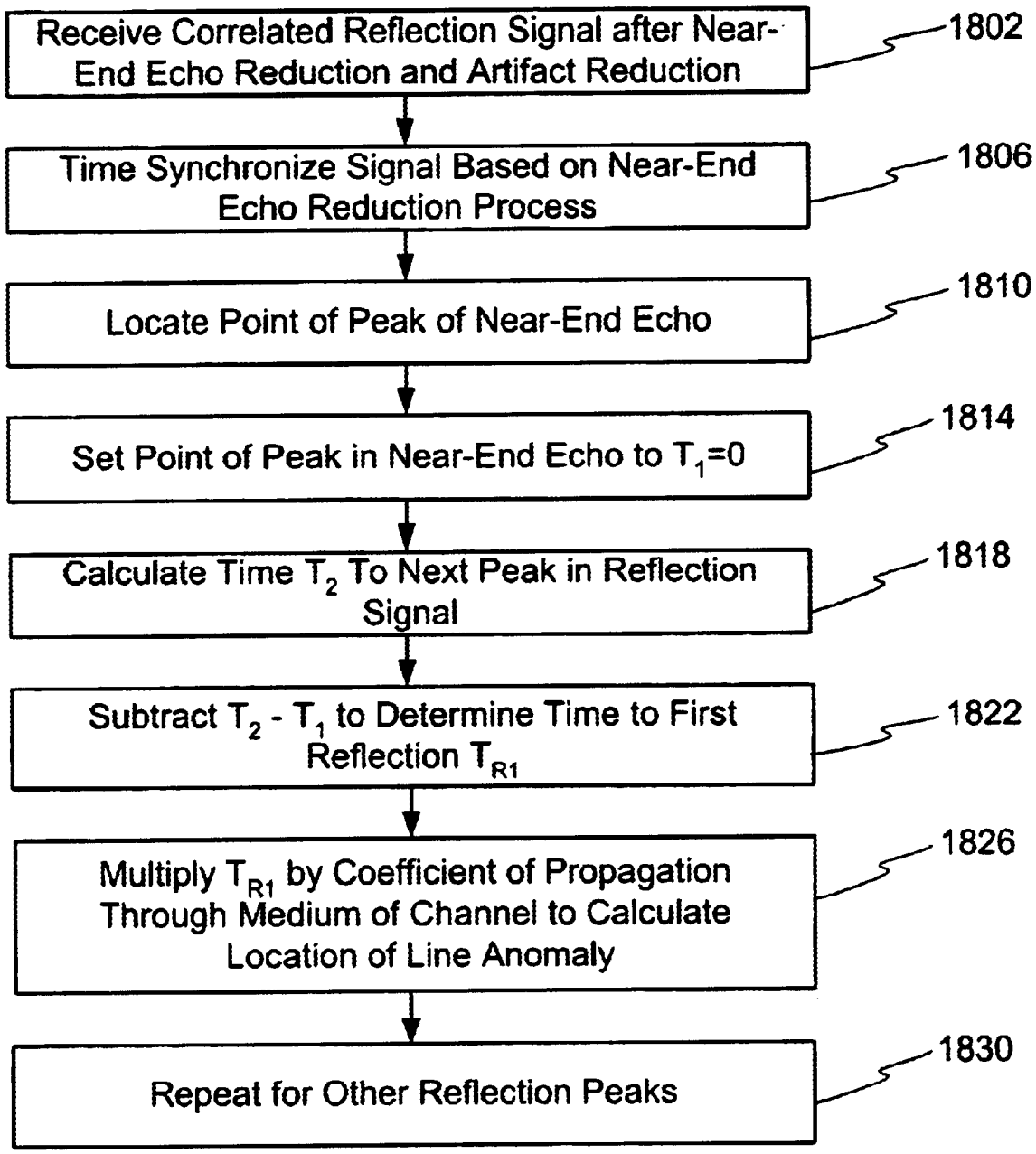
FIG. 18 illustrates an example method of processing the sequence signal to determine the location of line anomalies.

FIG. 18 illustrates an example method of processing the sequence signal to determine the location of line anomalies.

In one embodiment, the sequence time domain reflectometry system is built into a modem. In one embodiment, the processing comprises a two-part process; alignment and time measurement. At a step 1802, the processing operation receives the correlated reflection signal. In one embodiment at this stage, the correlated reflection signal has undergone correlation, near-end echo reduction, and artifact reduction. After receipt, the operation may time synchronize the signal based on the information obtained during the near-end echo reduction processes. In one embodiment, the peak of near-end echo is the beginning of the reflection signal because the near-end echo occurs generally simultaneously with the start of the sequence transmission. Working from this basis, the time at which the peak of the near-end echo occurs is taken to be the start of the signal. This occurs at step 1810. In one embodiment, this information is provided from the near-end echo reduction module described in conjunction with FIG. 17.

At a step 1814, the peak in the near-end echo is assigned $T_1$ and referenced as time=0. Thereafter, at a step 1818, the operation calculates, in relation to $T_1$, the time at which the next peak in the reflection signal occurs. This is assigned time $T_2$. At step 1822, the processing subtracts $T_2$ from $T_1$ to determine the time it took between the sequence signal start and the first reflection. This time is assigned $T_{R1}$ for purposes of this discussion. Next, at step 1826, the process multiplies $T_{R1}$ by the velocity of propagation for the signal through the medium of the channel. This calculation yields a distance value, which reveals the location of the first line anomaly. At a step 1830, the operation repeats for the other peaks in the reflection signal.

Figure 19:
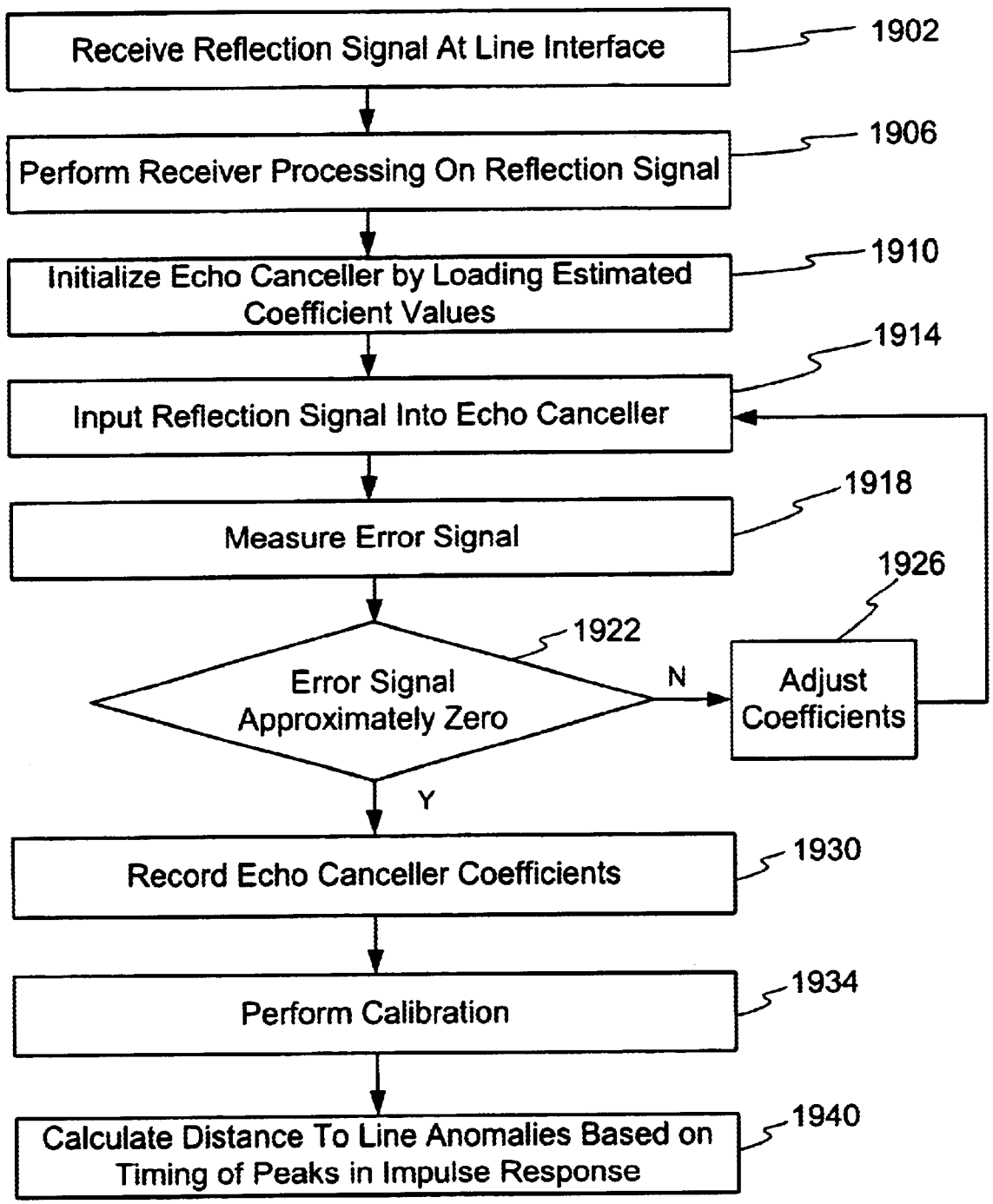
FIG. 19 illustrates an example method of operation for sequence time domain reflectometry using echo cancellation.

FIG. 19 illustrates an operational flow chart for an example method of operation for sequence time domain reflectometry using echo cancellation. This alternative embodiment is shown in FIG. 10. At a step 1902, this embodiment receives the reflection signal at the line interface and thereafter, at a step 1906, performs receiver processing on the reflection signal to prepare the signal for further processing. Next, at a step 1910, the operation initializes an echo canceller by loading estimated coefficient values into the echo canceller. This prepares the echo canceller to receive an input and generate an output. In one embodiment, the stored estimated coefficients comprise coefficients that are estimated to closely resemble the coefficients that will eventually be selected for the echo canceller. In one embodiment, the echo canceller comprises a finite impulse response filter. In one embodiment, the echo canceller includes a Volterra series expansion to model non-linear affects such as cable resistance, inductance and capacitance.

At a step 1914, the embodiment inputs the reflection signal into the echo canceller causing the echo canceller to generate an output based on the input and the loaded coefficients. The operation progresses to a step 1918 whereby the output of the echo canceller is subtracted from the reflection signal and any error or difference between the signals measured and fed back into the echo canceller. The error signal is the difference between the echo canceller output, which is determined by the coefficient values, and the reflection signal.

At a step 1922, the system determines if the error signal is approximately equal to zero. A generally zero error signal or equivalent is desired. If the error signal is not zero, then the operation, at a step 1926, adjusts the coefficients of the echo canceller to cause the error signal to approach zero. This processes continues until the error signal is generally zero. When, at step 1922, the error signal is generally zero, then the echo canceller coefficients are read at step 1930, from the echo canceller. These coefficients, when considered as a sequence, form an estimate of the impulse response of the reflection channel and can be used to determine the location of the line anomalies. The coefficients can be considered as the impulse response or a pulse followed by zeros may be fed into the echo canceller and the output recorded.

At step 1934, the operation may perform calibration to remove near-end echo or other unwanted signal components. In one embodiment this may be considered signal shaping. At a step 1940, the system calculates the time between peaks of the impulse response of the reflection channel. Working from the time between pulses, processing occurs to calculate the distance to line anomalies based on the time at which peaks occur in the impulse response.

This is an exemplary method of operation of the alternative embodiment of sequence time domain reflectometry using echo cancellation techniques. It is contemplated that other methods of processing may be adopted for use with the echo canceller embodiment. The scope of the claims is not intended to be limited to this particular method of operation, but is intended to cover any method of sequence time domain reflectometry utilizing the coefficients of a prediction filter.

Figure 20:
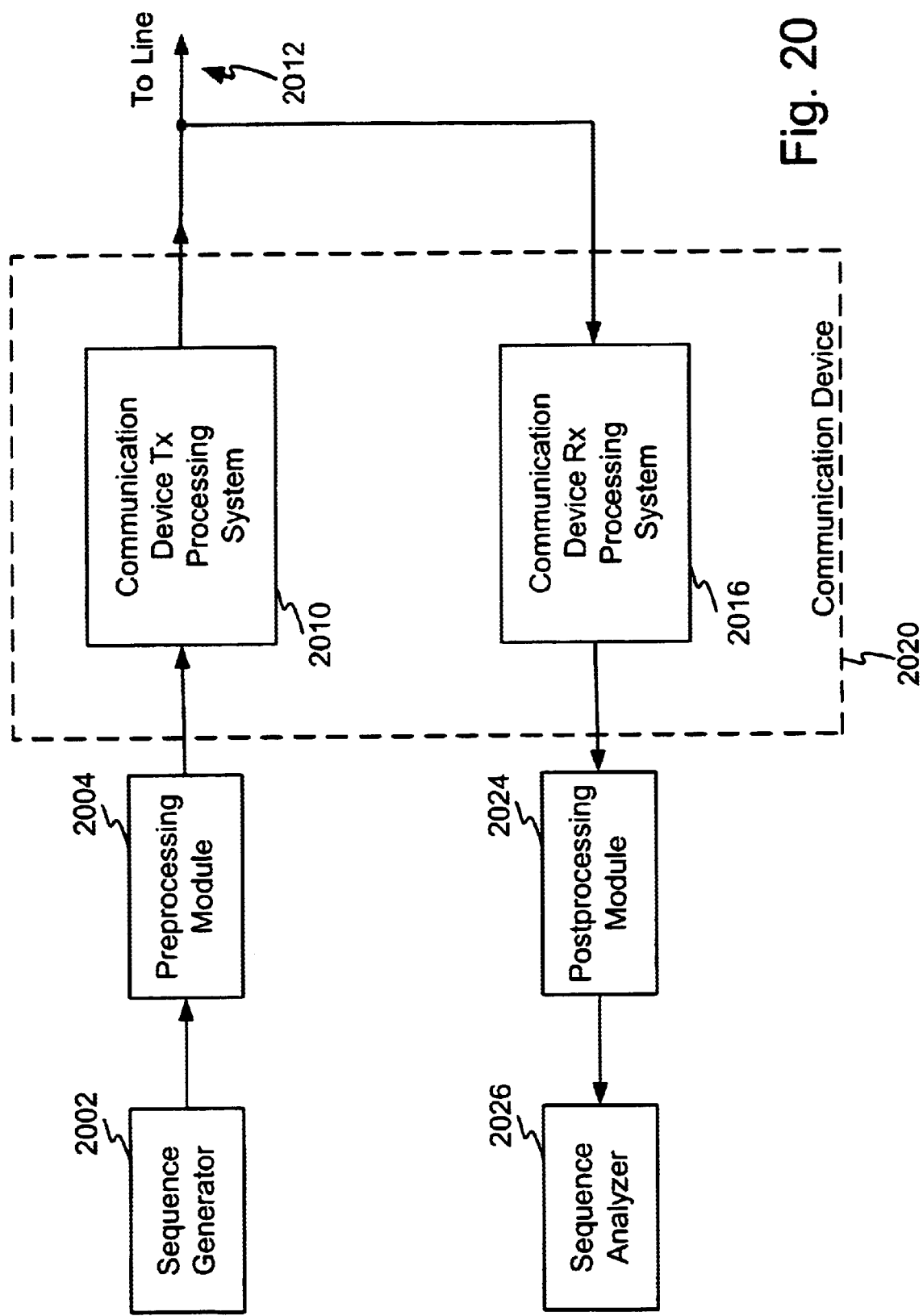
FIG. 20 illustrates a block diagram of one embodiment configured with preprocessing and post-processing capability.

FIG. 20 illustrates a block diagram of one embodiment configured with preprocessing and post-processing capability. As shown, a sequence generator 2002 connects to a preprocessing module 2004. The output of the preprocessing module 2004 connects to a communication device transmit processing system 2010. The output of the communication device transmit processing 2010 system outputs the data or signal to be transmitted to a transmission line 2012. It is contemplated that the transmission line 2012 connect to a remote communication device (not shown). Communication between remote communication devices or systems is described above in greater detail.

A communication device receiver processing system 2016 connects to the line 2012 and is configured to receive and process incoming signals. Collectively the communication device receiver processing system 2016 and the communication device transmit processing system 2010 may be considered to comprise a communication device 2020. The communication device 2020 may comprise a type communication system or may operate under any protocol or standard. The output of the communication device receiver processing system 2016 connects to a post-processing module 2024. The post-processing module 2024 connects to a sequence analyzer 2026. In one embodiment the sequence analyzer 2026 comprises or includes a correlator. The sequence analyzer 2026 may be configured to perform correlation and processing on a reflection of the sequence signal to determine the location of one or more line anomalies. This process is described above in more detail. In summary, a sequence signal and its corresponding reflection provide a desired signal for line probing. Modification of the sequence signal or its reflection, such as may occur by the communication device 2020 may frustrate desired operation.

Each aspect is now discussed. It is contemplated that each component may be configured to operate under or enable any communication standard, protocol, or format. As described above, the sequence generator 2002 is configured to generate a sequence or retrieve a desired sequence from memory. The communication device 2020 performs processing on a signal presented to the communication device prior to the signal being transmitted over the line 2012. As a result, the sequence signal generated by the sequence generated would be modified prior to being sent over the line. This is undesirable and may hinder operation of the line probe and line anomaly location operations described above.

To counter or overcome the effects of the communication device transmit processing system 2010 a preprocessing module 2004 is placed between the sequence generator 2002 and the input to the communication device transmit processing system 2010. The preprocessing module 2004 is configured to counter or negate the changes to the sequence signal that will occur as a result of the sequence signal passing through the communication device transmit processing system 2010. Absent the effect of the preprocessing module 2004 the sequence signal may be so undesirably modified by the communication device transmit processing system 2010 that the signal transmitted over the line 2012 would be so dissimilar to a sequence signal that processing of the reflected sequence signal would not yield the necessary information.

With regard to the receive path over which the reflected sequence signal travels, the communication device receiver processing system 2010 performs processing on the reflected sequence signal. This processing may undesirably distort or modify the received reflection signal. To correct or reverse the effects of the communication device receiver processing system 2016 the embodiment shown in FIG. 20 includes a post-processing module 2024. The post-processing module 2024 may perform any type processing as is contemplated and/or necessary to reverse the effects of the communication device receiver processing system 2016. The output of the post-processing module 2024 are forwarded to the sequence analyzer for processing as would occur upon a reflected sequence signal. In one embodiment the signal output from the post-processing module 2024 is a sequence signal reflection.

In short, the pre-processing module 2004 is configured to cancel the effects of the communication device transmit processing system 2010 to thereby cause the signal as output from the sequence generator 2002 to be transmit over the line 2012. Similarly, the post-processing module 2024 is configured to cancel the effects of the communication device receiver processing system 2016 and thereby pass to the sequence analyzer 2026 a reflection signal as received over the line 2012. It is contemplated that in one embodiment the preprocessing and post-processing system 2004, 2016 may be particularly useful in adapting communication systems 2020 with processing that may otherwise distort the sequence signals to operate with sequence signal line probing and the line anomaly location systems described herein.

Figure 21:
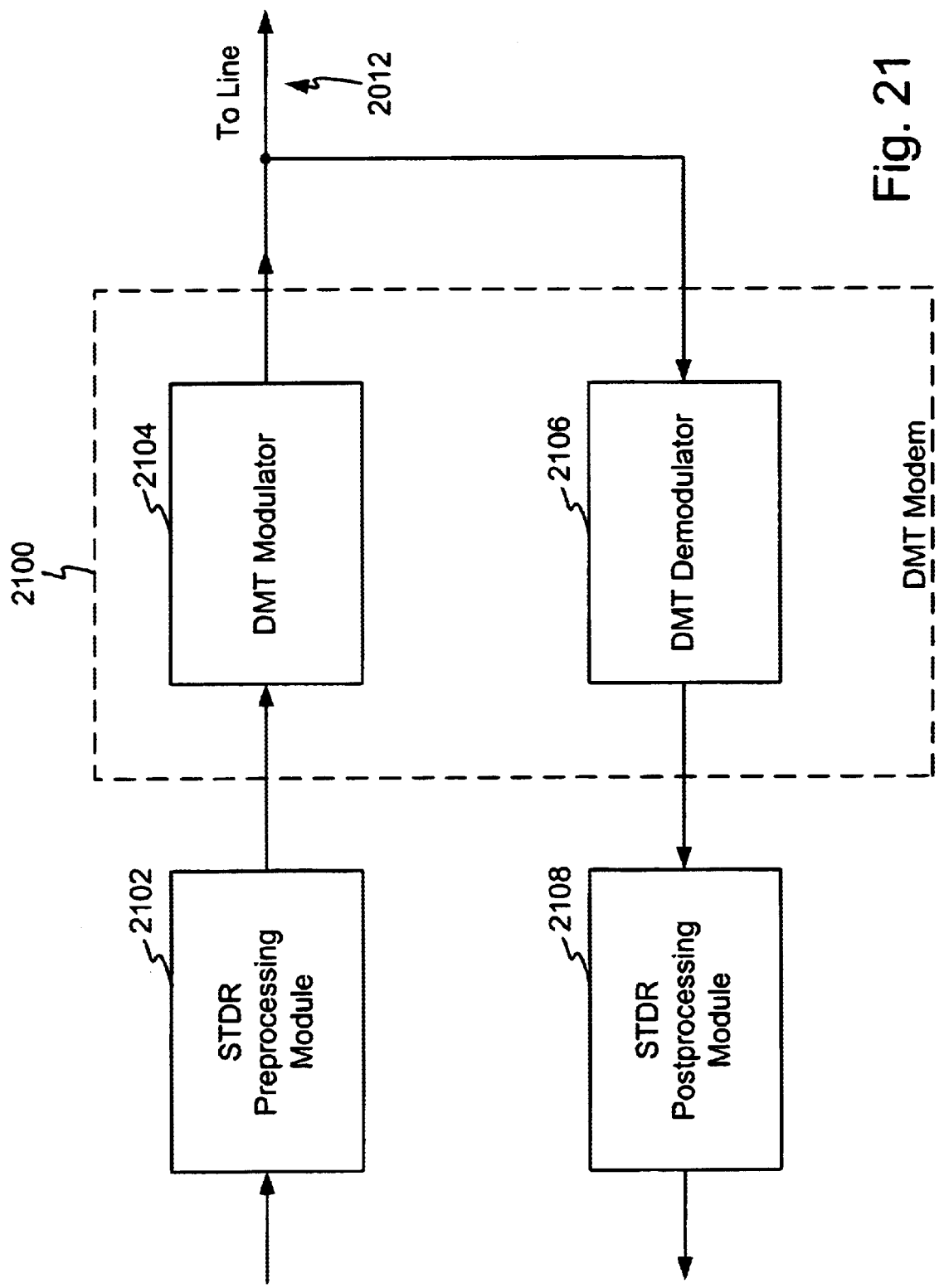
FIG. 21 illustrates a block diagram of an example embodiment STDR system configured to operate with discrete multitone (DMT) modulation and demodulation.

FIG. 21 illustrates a block diagram of an example embodiment of a STDR system configured with operate with a system having discrete multitone (DMT) modulation and demodulation. As shown, the sequence time domain reflectometry (STDR) preprocessing module 2102 is configured to receive a line probe signal, such as a sequence signal, and perform processing on the signal to counter the effects of the DMT modulator 2104. Because the effect of the preprocessing module 2102 and the DMT modulator 2104 cancel, the sequence signal is thereby transmitted on the line 2012.

The embodiment of FIG. 21 also includes an STDR post-processing module 2108 configured to receive the signal from a DMT demodulator 2106 and reverse the effects of the DMT demodulator 2106. Through inclusion of the STDR post-processing system 2108 the effects of the DMT demodulator 2106 may be reversed. This allows a reflected sequence signal received over the line 2012 to be presented to a STDR system for processing, such as correlation and analysis. If the reflected sequence signal were subjected to DMT demodulation the desirable correlative properties described above would be lost.

Figure 22:
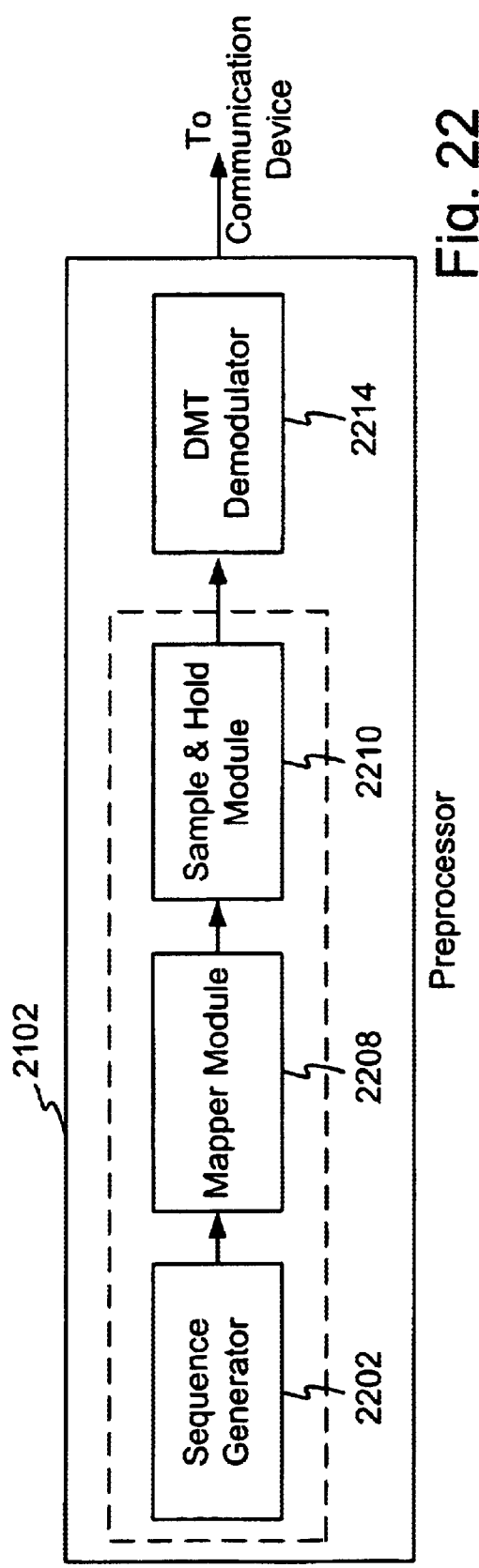
FIG. 22 illustrates a more detailed block diagram of the STDR processing module referenced in FIG. 21.

FIG. 22 illustrates a more detailed block diagram of the STDR processing module 2102 referenced in FIG. 21. In the example embodiment of FIG. 22, the STDR processing module 2102 comprises a sequence generator 2202 connected to a mapper module 2208. The output of the mapper module 2208 connects to a sample and hold module 2210 and the output of the sample and hold module feeds into a DMT demodulator 2214.

The sequence generator 2202, mapper module 2208, and the sample and hold module 2210 are described above in detail and accordingly not described again beyond that these components operate to generate a sequence signal for transmission over a line in a desired manner. In one embodiment the sequence generator is embodied using a scrambler with the input set at a logical one. In one embodiment three or more periods of the sequence are transmitted.

One example of the mapper 2208 is a 2-PAM mapper. In one embodiment the sequence may be made antipodal by the mapper 2208. The sample and hold module 2210 may create a two-sample per symbol sequence. In one preferred embodiment this is a desired signal. It is further contemplated that the STDR preprocessing, such as signal generation and manipulation, may be precomputed and stored to minimize the run-time computational burden.

In the example embodiment, such as shown in FIG. 22, a DMT demodulator 2214 is inserted to perform demodulator prior to transmission of the signal over the line. The DMT demodulator 2214 performs a demodulation operation on the signal prior to the signal being sent to the DMT modulator 2104 (FIG. 21). As a result, the modulation process performed by the DMT modulator prior to transmission restores the sequence signal. Thus the desired signal is transmitted over the line. It is contemplated that in other embodiments other types of processing may occur in advance of processing by the communication components to reverse or negate the effects of the communication component processing. In this example embodiment the DMT demodulator is shown to counter the effects of DMT modulation. In other embodiments other types of preprocessing may occur as may be necessary to counter the effects of other types of communication device processing. In one example embodiment the DMT demodulator 2214 is included with a system operating under the asynchronous digital subscriber line (ADSL) standard. ADSL system utilized a DMT modulation/demodulation scheme.

Figure 23:
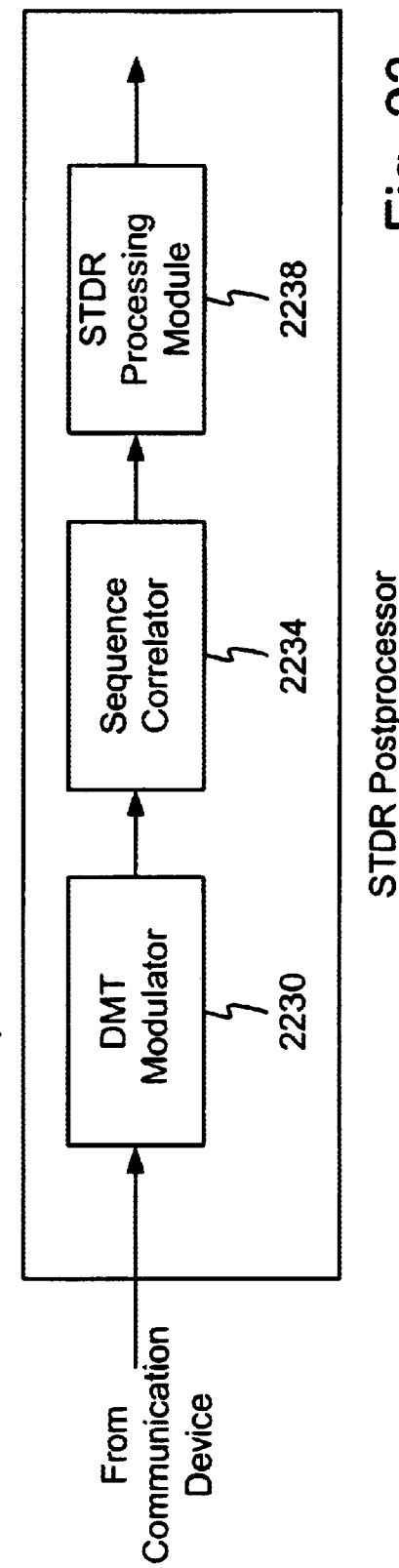
FIG. 23 illustrates a detailed block diagram of an example embodiment of the STDR post-processor shown in FIG. 21.

FIG. 23 illustrates a detailed block diagram of an example embodiment of the STDR post-processor 2108 shown in FIG. 21. The input to STDR postprocessor 2108 is received from a communication device, the communication device receiving signals over the transmission line. In one embodiment the received signal is a reflection signal of a sequence signal sent over the line to facilitate line probing. This reflection signal can be considered a sequence which is the convolution of the transmit signal with the echo channel impulse response. A periodic extraction of the echo channel impulse is extracted by correlation with one period of the sequence. In one embodiment the sampling occurs at twice the symbol rate and the correlation is performed separately on each phase. In one preferred embodiment analysis occurs based on the total energy in the correlator output. It is contemplated that in one embodiment post-processing functions are offloaded to an external resource.

In this example embodiment the STDR post-processor 2108 comprises a DMT modulator 2230 configured to receive the input from a communication device. The output of the DMT modulator 2230 connects to a sequence correlator 2234 and the output of the sequence correlator connects to a STDR processing module 2238. The DMT modulator 2230 is configured to reverse the effects of DMT demodulation such as occurs in the system shown in FIG. 21. An example of a system that utilizes DMT demodulation on incoming signals is ADSL. Thus, the DMT modulator 2230 reverses the effects of the DMT demodulation done by the ADSL system. In one embodiment other types of negating or counter processing may be performed to account for any communication system with which the STDR system is linked or enabled.

In one embodiment the output of the DMT modulator 2230 comprises a reflection of a sequence signal. The reflection is provided to the sequence correlator 2234 wherein the signal is correlated. Correlating the signal provides useful data regarding the location of the line anomalies. STDR processing module 2238 may be configured to perform this type of processing or any other desired processing. Operation of correlator 2234 and processing module 2238 are described in detail above. Accordingly they are not described again beyond that the sequence correlator 2234 and the STDR processing module 2238 may be configured to determine a point of correlation, which in turn may be used to determine the location of one or more line anomalies. Line anomalies may prevent or disrupt desired communication system operation.

While the principles described above may apply to any communication system, they are particularly useful in a communication system operation in accordance with the ADSL standard. An ADSL communication system utilizes a DMT modulation and demodulation scheme prior to transmission and upon reception of a signal. The principles described above enable the STDR operations to successfully occur in an ADSL system.

Figure 24:
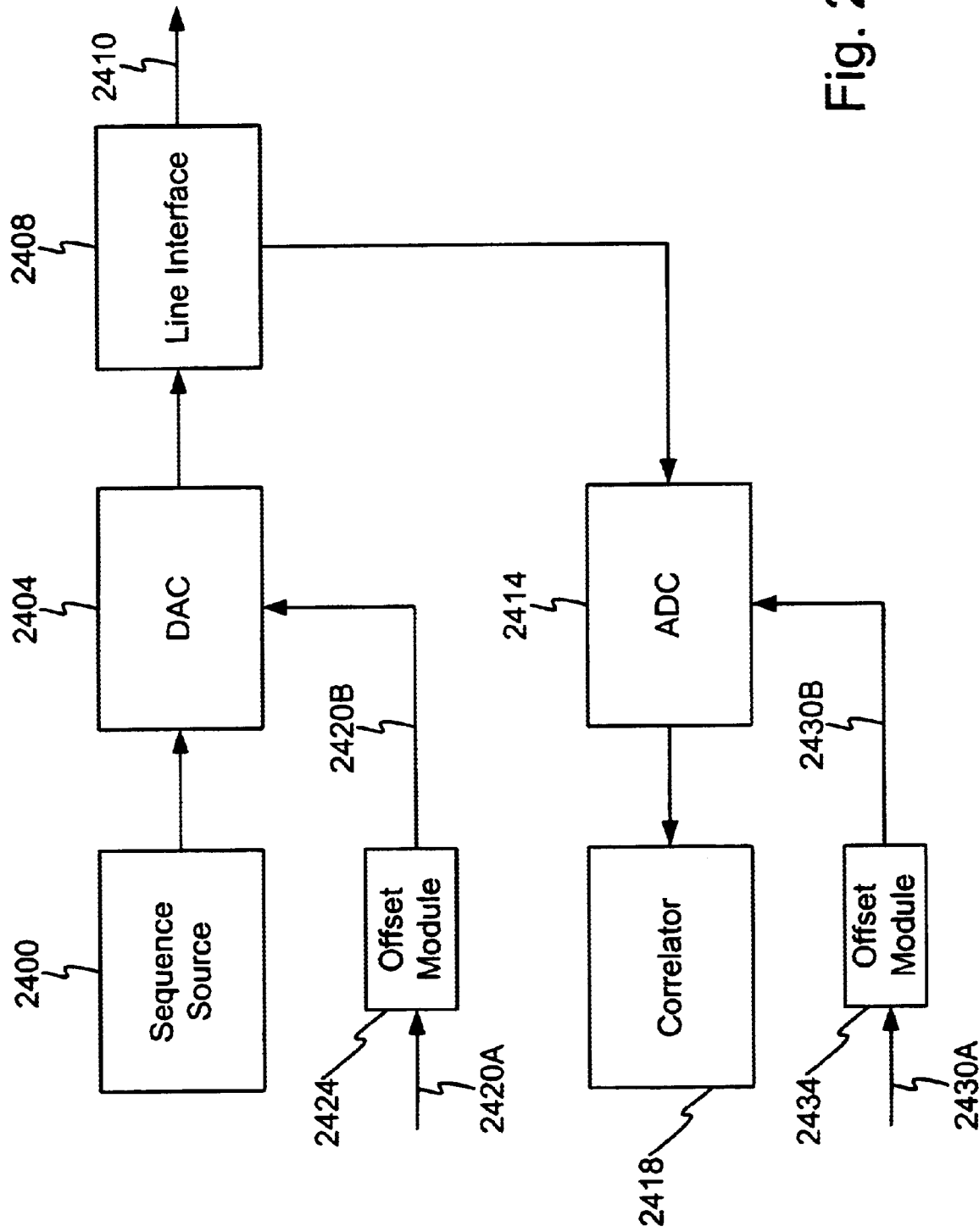
FIG. 24 illustrates a block diagram of an example embodiment of the STDR system configured to perform sampling offset.

FIG. 24 illustrates a block diagram of an example embodiment of the STDR system configured to perform sampling offset. As can be understood by one of ordinary skill in the art, it is desirable to locate a line anomaly with as great of accuracy as possible. Thus, it is desirable to increase the resolution or accuracy of the STDR system. By more accurately identifying the location of a line anomaly or the type of line anomaly the more quickly line crews may be dispatched to remove or reduce the effects of the line anomaly. In other instances, increasing the resolution may result in detection of less obvious line anomalies or a more distant line anomaly without increasing the power levels of the transmitted signal. Increasing the resolution, as described herein, without increasing the power level of the transmitted line probe signal achieves the advantage of detecting more remote or more subtle line anomalies without use of a high power pulse that may disrupt operation of other conductors in the bundle and without need for a high power transmit system. As described below in greater detail, increasing the resolution by increasing the number of samples will allow for detection of signal aspects that might otherwise be obscured by aliasing or other factors.

In one embodiment the resolution of the STDR system is modified, such as increased, by modifying the clock signal used for the sampling clock. By modifying the clock signal over two or more re-iterations of the STDR operation the magnitude of the points of correlation, occurring in different iterations, may be compared to locate a point of correlation with the greatest magnitude. In this manner, the location of the line anomaly may be more accurately determined. One example of clock signal modification comprises increasing the clock frequency. By increasing the clock frequency more data points are provided. With more data points available for analysis in the reflection signal there exists greater resolution and hence the distance at which a line anomaly is located may more accurately be determined.

While increasing the clock frequency provides the advantage of increased resolution, operating the sampling clock at an increased rate may not always be an option. Numerous communication systems are clock rate limited. Hence, there is a fixed and maximum clock rate for some systems. In addition, increasing the clock rate can result in an increase in the level of attenuate as the signal passes through the channel, which in turn can reduce the system's ability to detect faults or distant line anomalies.

In one embodiment the sampling clock is modified by changing the phase offset of the sampling clock. By modifying the phase or introducing a phase offset into the sampling clock the samples occur at different times in the received reflection signal as compared to a sampling based on a non-phase offset sampling clock. When the STDR operation executes numerous times, each time with a different phase offset, numerous different data points are generated for each STDR execution. Each data point corresponds to a different time period in each of the received reflection signals and hence a different location in the line. Through analysis of the points of correlation of the data samples between each STDR operation, a point of correlation with the greatest magnitude or other feature of interest may be identified. Points of correlation may identify a line fault or line anomaly. For the points of correlation in each of the phase offset STDR operations, the point of correlation with the largest magnitude may identify most accurately the location of the line anomaly. In this manner a more accurate line STDR operation may occur. This process is discussed below in greater detail.

Returning to FIG. 24, as described above in greater detail, the sequence source 2400 may comprise a sequence generator, scrambler, or memory system with pre-stored data. The output of the sequence source 2400 connects to a digital to analog converter (DAC) 2404 or any other sampling device. In such an embodiment the DAC 2404 converts the digital signal to an analog format for transmission through the line interface 2408. The DAC 2404 receives a clock signal 2420B. The clock signal 2420B controls the sampling period of the ADC. In the embodiment shown in FIG. 24, the clock signal 2420B is received from an offset module 2424. The offset module 2424 may modify the clock signal by introducing an offset into a unmodified clock signal 2420A. The offset module 2424 is discussed in greater detail below. The output of the line interface 2408 connects to a transmission line 2410. In one embodiment the line interface 240 comprises a hybrid.

In one embodiment the sequence source 2400, the DAC 2404, and the line interface 2408 transmits a sequence signal out over the line 2410. After transmitting a sequence signal, the line interface 2408 is configured to direct a reflection of the sequence signal into an analog to digital converter (ADC) 2414. The ADC 2414 converts the analog reflection signal to a digital format for subsequent processing by a correlator 2418. The ADC 2414 receives a clock signal 2430B to control the sampling and hold timing. The clock signal 2430B is received from an offset module 2434. The offset module 2434 receives an unmodified clock signal 2430A. Operation of the sequence source 2400, DAC 2404, line interface 2408, ADC 2414, and the correlator 2418 occurs as described above and accordingly is not described in great detail again.

Figure 25:
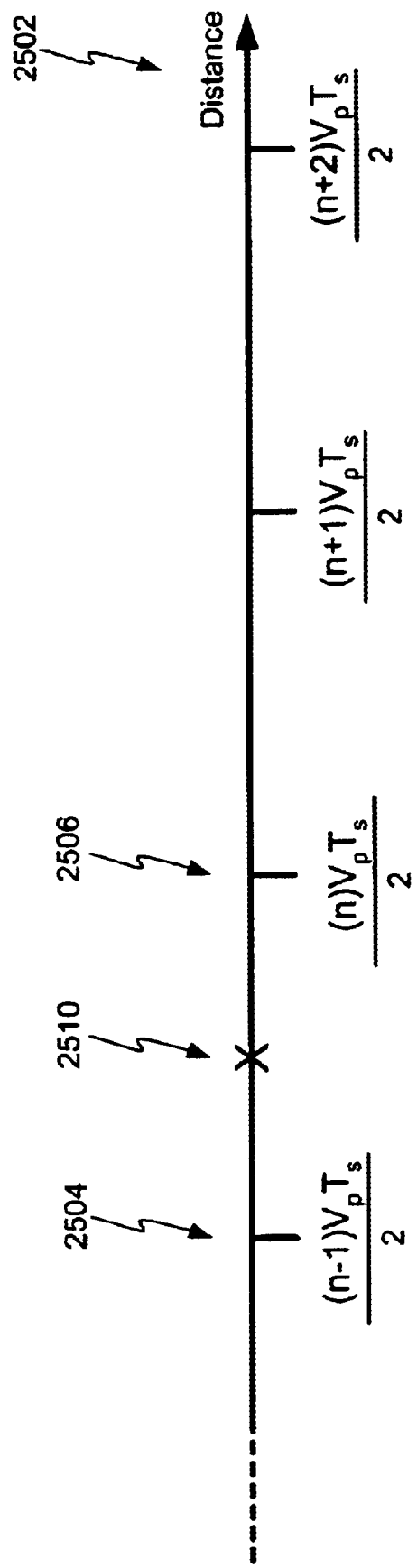
FIG. 25 illustrates a plot of a line anomaly location in relation to transmission line distance components.

FIG. 25 illustrates a plot a line anomaly location 2510 in relation to transmission lines distance components. A mathematical discussion of line probe is now provided to aid in understanding the relationship between the sampling time of the clock signals provided to the DAC and ADC and location of line anomalies. The distance to a line anomaly may be defined as $D_{fault}$ where:

$$D_{fault} = \frac{1}{2} V_P T_P$$

such that $V_P$ is the velocity of propagation of the sequence signal and $T_P$ is the time of propagation of the sequence signal (round trip) between the point of generation and the line anomaly. It should also be assumed that the STDR system obtains correlation data at sampling points in the received reflection signal. Hence the $T_P$ may be represented as:

$$T_P = nT_S$$

where n is an integer and $T_S$ is the sampling period. Thus the calculated time of propagation may only assume a time at which a sample point occurs. Thus these equations may be combined to yield:

$$D_{fault} = \frac{1}{2} nV_P T_S$$

As a result, D is quantized into steps of $V_P T_S/2$.

Furthermore it follows that the resolution for locating a line anomaly is set at $V_P T_S/4$ because the maximum distance at which a fault may be located is one-half of the distance between a sampling point. FIG. 25 is helpful in understanding the location of sampling points in relation to distance from the transmitter and the speed of propagation. A horizontal axis 2502 represents distance. A point 2504 is defined by a distance $(n-1)V_P T_S/2$ and a point 2506 is defined by a distance $(n)V_P T_S/2$. If the sampling points are at points 2504 and 2506, the maximum distance of error is $V_P T_S/4$, which is one-half the distance between the points defined by (n-1) and n. By way of example, point 2510 is ½ way between point 2504 and point 2506. Since it is ½ way between these points, the error is ½ the distance between points 2404 and 2406. Hence the resolution is $V_P T_S/4$.

In one embodiment is desired to improve the resolution of the line anomaly location system described herein. In general, this goal may be met by adjusting the sampling phase of either of the DAC clock signal or the ADC clock signal. Thus, in reference to FIG. 24, an offset module 2424 or 2434 may be included to adjust the phase of the clock signal. It is noted that either or both of the clocks may be adjusted to be out of phase. Thus, in one embodiment only one offset module 2424 or 2434 is included.

In one embodiment the sampling phase of the converter 2404 or 2414 is adjusted by a value:

$$\frac{-KT_S}{M} \quad (K = 1 \ldots M - 1)$$

relative to the sampling phase of the other converter 2404, 2414. By changing the value of K, the value that provides the largest far end echo can be determined. This value of K can be used to determine with greatest accuracy the distance at which the line anomaly is located. Stated another way, a value of K is selected with produces the largest far end echo, the far end echo being generated by the line anomaly. This value of K is then utilized to determine a distance, i.e. location, to the line anomaly.

It should be noted that the highest peak of the near end echo, which can be used as a time reference point in the distance estimate, may not occur in the same measurement as the highest peak of the far end echo from the line anomaly. Thus, in one embodiment, to obtain the highest resolution estimate the method and apparatus as described herein first established the time reference point by identifying the highest near end echo peak. Thereafter, the highest far end echo peak is identified. The method and apparatus may then subtract the time of the highest far end echo peak by the time of the highest near end echo peak to determine an estimate of roundtrip propagation delay. Using this estimate for roundtrip propagation delay, a distance to the line anomaly may be computed.

Figure 26:
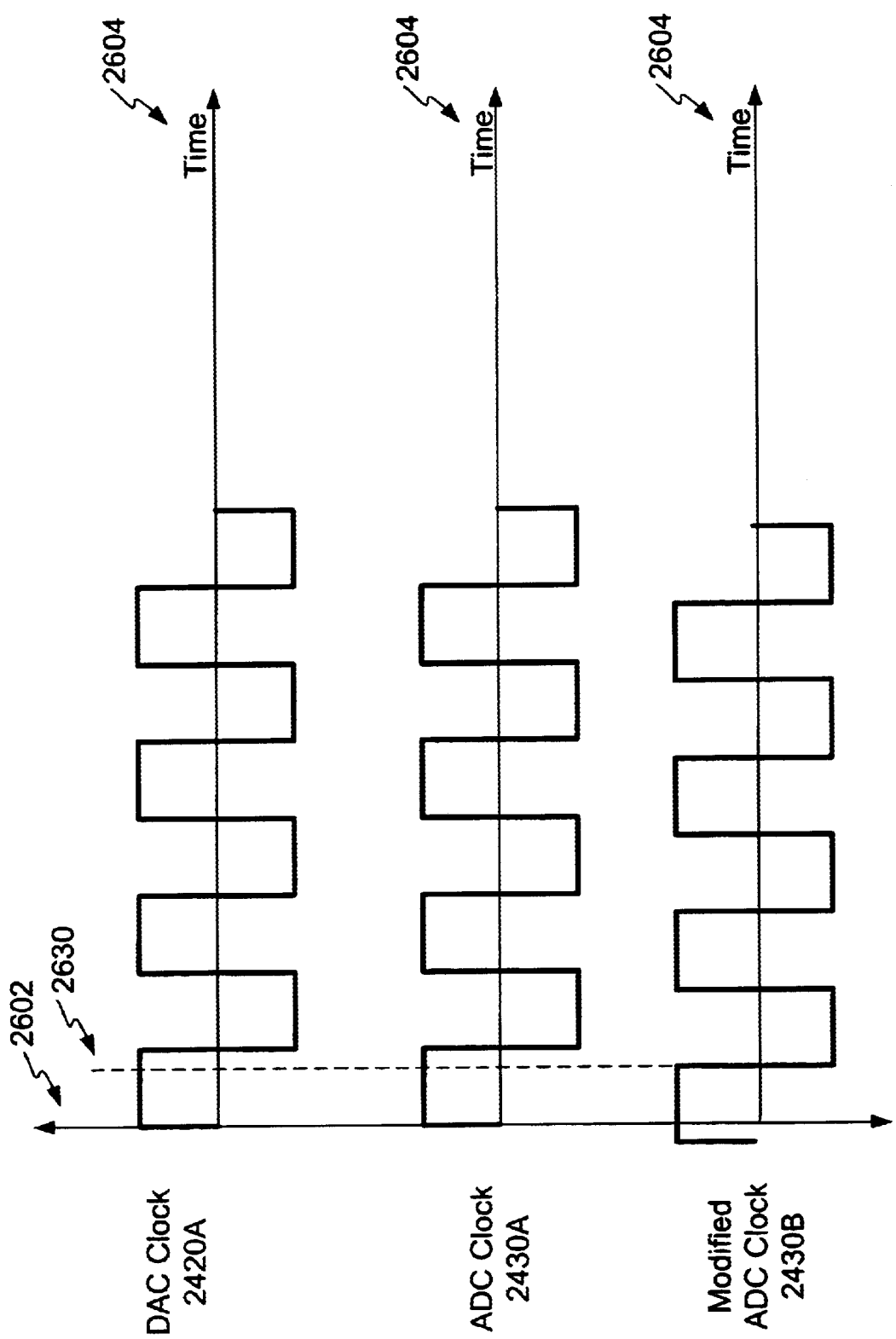
FIG. 26 illustrates a plot of various unmodified and modified clock signals.

In reference to FIG. 26, a plot of various unmodified and modified clock signals are shown. The clock signals are plotted against a common time axis 2604 to thereby illustrate timing of offset differences. A vertical axis 2602 is a gauge of magnitude for each of the exemplary clock signals 2420A, 2430A and 2430B. A horizontal axis 2604 represents time for each of the clock signals. A time T1 2630 is provided for reference.

As can be seen, clock signal 2420A and 2430A having a rising edge starting at the same time. However, based on desired operation of offset module 2434, clock signal 2430B is modified to have a rising edge earlier in time than the DAC clock 2420A. Thus, the clock signal 2430B is offset as compared to clock signal 2420A. In one embodiment the ADC clock signal of the receiver portion of the system is modified relative to the DAC clock signal of the transmitter portion of the system. In one embodiment the DAC clock signal of the transmitter portion of the system is modified relative to the ADC clock signal of the receiver portion of the system. In other embodiment it is contemplated that these principles may be applied to other aspects of the sequence time domain reflectometry systems without departing from the scope of the claims that follow.

Combining the above-provided equations, it can be shown that:

$$D_{fault} = \frac{1}{2} V_p (nT_S + KT_S)$$

where the resolution is now defined by:

$$\frac{KV_P T_S}{4M}$$

Thus during an exemplary first test line anomaly location data is obtained based on multiples of $nT_S$. During a second test, location data is obtained for locations defined by $nT_S \pm T_S/M$. In one embodiment the sampling time is varied or delayed by a fraction of the sampling period. Varying the time at which samples are taken has the mathematical effect of varying the distance at which samples are taken. As a result, additional samples or obtained. After obtaining any number of desired samples a comparison may be made to determine the sample at which the largest magnitude of correlation occurs. Using this sample data the location of the line anomaly may be calculated with greater accuracy. A greater number of tests will yield more sample data and accuracy may be further improved.

Figure 27:
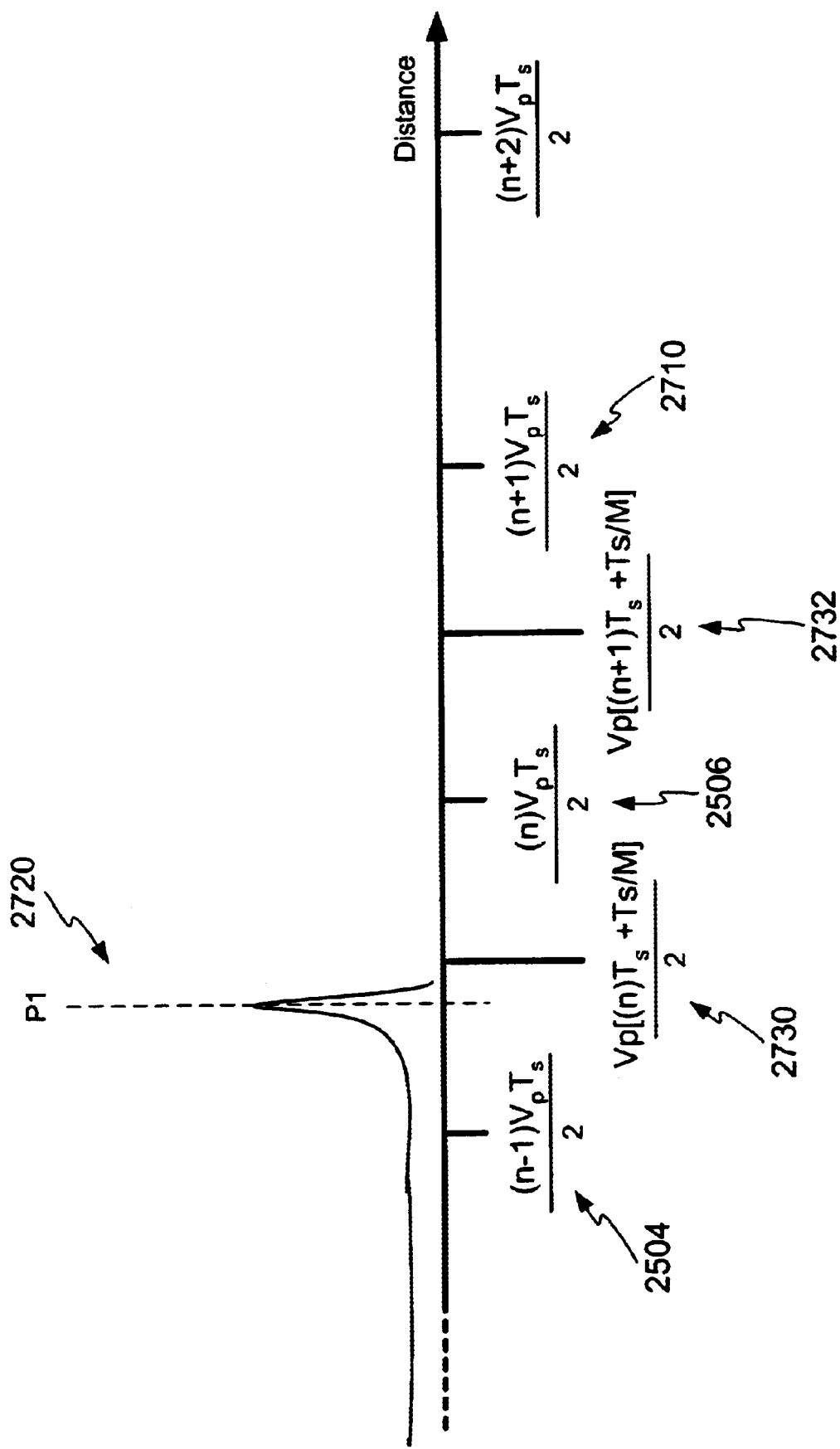
FIG. 27 illustrates a plot generally similar to that shown in FIG. 25, and further includes an additional degree of resolution.

FIG. 27 illustrates a plot similar to that shown in FIG. 25, and further includes an additional degree of resolution. An example correlated sequence signal is shown for purposes of discussion. Without the increased resolution of the out of phase sampling, the only distance data would be provided at such as points 2504, 2506, and 2710. Thus, the distance at point P1 2720 would be selected and crews may be dispatched to remove or repair the line anomaly. It is generally understood to be desirable to obtain more accurate distance information regarding the location of a line anomaly.

Using the principles described above, the resolution of the STDR system may be increased to further include the sampling points 2730 and 2732. As can be seen, the point of correlation is at a point P1 2720. Thus sampling point 2730 provides more accurate location information regarding location of the anomaly than sampling point 2504 or point 2506. As a result, the increased resolution gained by the phase shifting operation provides a more accurate STDR operation thereby yielding more accurate information regarding the location of line anomalies. These principles may be extended to M number of tests to thereby reduce the error by a factor of M, i.e. increase the resolution by a factor of M. At high M values the return length of the line and the noise on the line may be limiting factors.

Numerous methods and apparatus are available to offset the phase of a clock or other signal and one of ordinary skill in the art may devise other methods and apparatus for offsetting or adjusting either of the ADC 2414 or DAC 2404 clock. FIGS. 27–30 illustrate block diagrams of example systems for introducing a phase offset into a signal. Other embodiments of systems to introduce offset are contemplated. In one embodiment, the clock generation may be designed or engineered to be out of phase and variable as compared to another clock signal. Any system or method for modifying the phase of one clock relevant to the other will achieve the increase accuracy described herein. In one embodiment the clock frequency may be increased. In other embodiments however, the clock rate or frequency may be limited or fixed. In one embodiment of a clock circuit a clock output is provided as an input to a counter. The counter, depending on its count rate and initial offset may be configured to provide a modified clock signal. For example, by initiating counter operation with an initial offset the phase or offset of one or more clocks may be adjusted relative to another clock or reference phase. By way of example and not limitation, in one embodiment the counter may be part of a numerically controlled oscillator that is used to create a lower frequency clock from a higher frequency clock. By initializing the counter to different initial values, the phases of the clock will be different relative to each other.

The term clock signal is used herein to mean a signal that controls a sampling period or other variable that changes the time at which a reflection signal is analyzed. Signals other than a clock signal may be modified or utilized to achieve the principles described herein.

Figure 28:
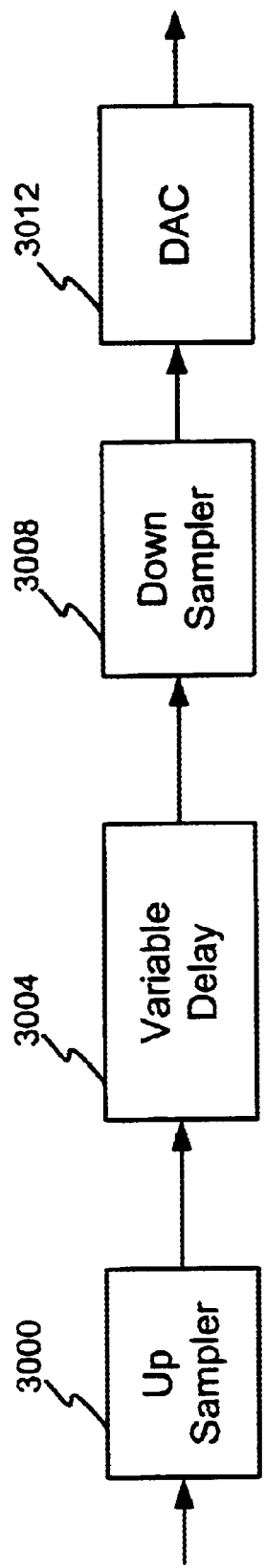
FIG. 28 illustrates a block diagram of an example embodiment of a clock signal modification circuit.
Figure 29:
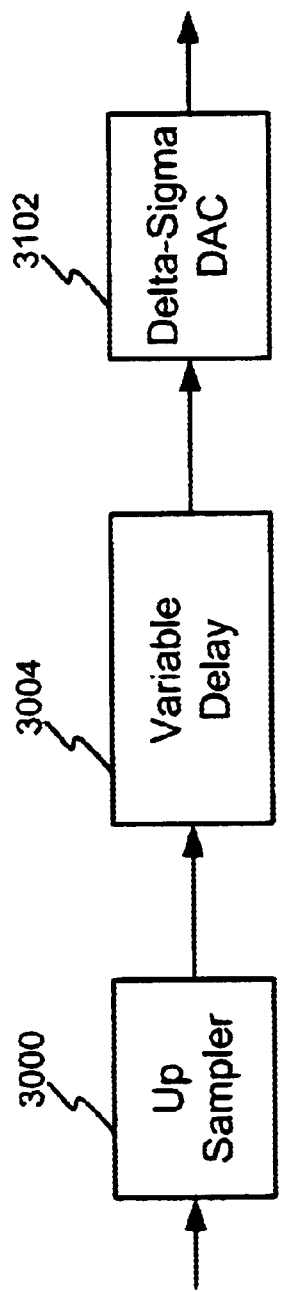
FIG. 29 illustrates a block diagram of a second example embodiment of a clock signal modification circuit.

FIGS. 28 and 29 illustrate block diagrams of example embodiments of phase or timing modification circuits. These embodiments, and other embodiments derived the refro m are well suited to modify a signal, such as the sequence signal transmitted over the channel. In contrast to modifying a clock signal, the sequence signal itself may be modified. In reference to FIG. 28, a modification circuit is shown that comprises an up-sampler 3000 connected to a variable delay 3004. The output of the variable delay 3004 connects to a down-sampler 3008. The down-sampler 3008 out put feeds into a digital to analog converter 3012.

In operation the up-sampler 3000 receives an incoming signal. In one embodiment the input to the upsampler 3000 comprises a sequence signal that is to be transmitted over the line for purposes of line probing or sequence signal time domain reflectometry. The up-sampler 3000 increases the amount of data during an iteration by inserting one or more values between adjacent existing values. Additional data points may be created based on interpolation. Any degree of up sampling may be performed. The up-sampled signal is delayed by a variable amount in the variable delay 3004. It is contemplated that any amount of delay may be introduced and that the amount of delay may be selectively controlled. In one embodiment the amount of delay is selected to provide a fractional symbol delay into the sequence signal after down sampling occurs. It is desired to introduce a fractional symbol delay, i.e. a delay less that or some fraction of the period of the sequence signal. Introducing delay can be considered to introduce a phase effect as compared to a non-delayed signal.

The delayed signal is provided to the down-sampler 3008. Down sampling disregards certain samples or portions of the signal. For example, down sampling by two disregards every other sample. Down sampling can be considered the opposite of up sampling. The output of the down-sampler 3008 is feed into a digital to analog converter 3012 which converts the digital signal from the down-sampler to an analog signal. This modified signal may then be transmitted over the channel that is the subject of the line probe or STDR operation. In this manner the sequence signal transmitted over the channel is modified in a manner to obtain greater resolution regarding the location of line anomalies. It is contemplated that the line probe operation may be repeated several times and during each iteration a different amount of fractional symbol delay be introduced into the sequence signal prior to transmission.

FIG. 29 is generally similar to FIG. 28. The down-sampler 3102 and DAC 3012 are replaced by a delta-sigma digital to analog converter 3102. The delta-sigma digital to analog converter 3102 performs digital to analog conversion at higher rates than a traditional DAC. By way of example, introducing a delay at high frequency, with the variable delay 3004, has the effect of performing a fractional delay at lower frequencies.

An integer delay at a high sampling rate equates to a phase offset that is a fraction of the total phase at a lower frequency. As a result, a phase offset that is a fraction of the period is introduced. The output from the Delta-Sigma DAC 3102 is thus a modified or a phase shifted version of the input to the up-sampler 3000.

While various embodiments of the application have been described, it will be apparent to those of ordinary skill in the art that many more embodiments and implementations are possible that are within the scope of this invention. Moreover, it is contemplated that the various features, elements, steps, or aspects described herein may be enabled alone or in any combination.

What is claimed is:

1. A method for performing time domain reflectometry on a communication channel comprising:
   generating a sequence signal;
   preprocessing the sequence signal to counter effects of pre-transmission processing, the preprocessing creating a preprocessed sequence signal;
   transmitting the sequence signal over a communication channel;
   receiving a reflection signal from the communication channel in response to the transmitting the sequence signal;
   post-processing the reflection signal to counter the affects of post-reception processing that occurs after receiving the reflection signal;
   correlating the reflection signal with the sequence signal to generate a correlated signal;
   retrieving a template signal;
   aligning the template signal and the correlated signal to determine a point of alignment;
   subtracting the template signal from the correlated signal to remove near-end echo from the correlated signal;
   measuring a time interval between the point of alignment and a subsequent peak in the correlated signal; and
   multiplying the time interval by the rate of propagation of the sequence signal through the communication channel to obtain distance information regarding a line anomaly.

2. The method of claim 1, wherein the effects of pre-transmission processing transforms the preprocessed sequence signal into the sequence signal.

3. The method of claim 1, wherein the template signal is a correlated version of a reflection created by a line interface.

4. The method of claim 1, wherein the sequence signal comprises a maximal length sequence signal.

5. The method of claim 1, wherein the communication channel comprises a twisted pair conductor.

6. The method of claim 1, wherein the preprocessing comprises DMT demodulation and post-processing comprises DMT modulation.

7. The method of claim 1, further comprising performing a circular rotation of the sequence signal to create a rotated sequence signal;
   transmitting the rotated sequence signal over the communication channel;
   receiving a rotated reflection signal;
   correlating the rotated reflection signal with the rotated sequence signal to create a rotated correlated signal;
   aligning the rotated correlated signal with the correlated signal; and
   adding the rotated correlated signal to the correlated signal to reduce or remove correlation artifacts on the correlated signal.

8. A system for modifying a sequence signal to counter the effects of a communication device, the system comprising:
   means for receiving a sequence signal;
   means for demodulating the sequence signal, the demodulation configured to counter a pre-transmission effect of a communication device transmitter;
   means for providing an output from the means for demodulating to the communication device transmitter;
   means for receiving a demodulated reflection signal from a receiver of the communication device, the reflection signal generated by transmission of a sequence signal over a transmission line;
   means for modulating the demodulated reflection signal to thereby counter the effects of the demodulation and restore the reflection signal; and
   means for processing the reflection signal, wherein the means for demodulating comprises a dual tone multi-frequency demodulator and the means for modulating comprises a dual tone multi-frequency modulator.

9. A method for performing time domain reflectometry on a communication channel comprising:
   generating an sequence signal, the sequence signal having a sampling rate with a first phase associated therewith;
   transmitting the sequence signal over a communication channel;
   receiving a reflection signal from the communication channel in response to the transmitting of the sequence signal;

sampling the reflection signal at a sampling rate having a second phase;

correlating the reflection signal with the sequence signal to generate a correlated signal;

repeating the steps of sampling and correlating one or more additional times to generate correlated signals, wherein during the one or more additional times the second phase is offset from the first phase; and selecting a point correlation with the largest amplitude from a correlated signal to calculate distance information.

10. The method of claim 9 further comprising:

retrieving a template signal;

aligning the template signal and a correlated signal to determine a point of alignment;

subtracting the template signal from the correlated signal to remove near-end echo from the correlated signal;

measuring a time interval between the point of alignment and a subsequent peak in the correlated signal;

multiplying the time interval by the rate of propagation of the sequence signal through the communication channel to obtain distance information regarding a line anomaly.

11. The method of claim 10, wherein the template signal is a correlated version of a reflection created by a line interface.

12. The method of claim 9, wherein a varying offset is introduced into the second phase at each of the repeating the steps one or more additional times.

13. The method of claim 9, wherein the communication channel comprises a twisted pair conductor.

14. The method of claim 9, further comprising performing a circular rotation of the sequence signal to create a rotated sequence signal;

transmitting the rotated sequence signal over the communication channel;

receiving a rotated reflection signal;

correlating the rotated reflection signal with the rotated sequence signal to create a rotated correlated signal;

aligning the rotated correlated signal with the correlated signal; and adding the rotated correlated signal to the correlated signal to reduce or remove correlation artifacts on the correlated signal.

15. A method for increasing the accuracy of a time domain reflectometry operation based on sequence signal analysis, the method comprising:

generating one or more sequence signals;

transmitting the one or more sequence signals over a transmission line;

receiving a reflection signal;

sampling the reflection signal at a first phase to create a first sampled signal;

correlating the first sampled signal to create a first correlated signal;

sampling the reflection signal at a second phase, the second phase being offset from the first phase, to create a second sampled signal;

correlating the second sampled signal to create a second correlated signal; and analyzing one or more points of correlation of the first correlated signal and the second correlated signal to determine a point of correlation with the greatest magnitude.

16. The method of claim 15, further comprising calculating a distance to a line anomaly based on the point of correlation with the greatest magnitude.

17. The method of claim 15, wherein at least one of the one or more sequence signals comprises an M-sequence.

18. The method of claim 15, wherein the correlation is cross-correlation.

19. The method of claim 15, wherein a first sequence signal is transmitted to create the first sampled signal and a second sequence signal is transmitted to create the second sampled signal.

20. A system for generating data, the data for use in locating a line anomaly, the system comprising:

a sequence source configured to provide a sequence signal;

a digital to analog converter connected to receive the sequence signal and convert the sequence signal to an analog waveform;

a transmitter configured to transmit the sequence signal;

a receiver configured to receive a reflection signal, the reflection signal comprising a reflection of the sequence signal;

an analog to digital converter configured to convert the reflection signal to a digital format, the conversion controlled at least in part by a clock signal;

a clock signal generator configured provide a clock signal to either or both of the digital to analog converter and the analog to digital converter; and a clock signal modifier configured to modify the clock signal provided to either or both of the digital to analog converter and the analog to digital converter, wherein the clock signal modifier comprises an up-sampler, a variable delay, and a down-sampler.

21. A system for generating data, the data for use in locating a line anomaly, the system comprising:

a sequence source configured to provide a sequence signal;

a digital to analog converter connected to receive the sequence signal and convert the sequence signal to an analog waveform;

a transmitter configured to transmit the sequence signal;

a receiver configured to receive a reflection signal, the reflection signal comprising a reflection of the sequence signal;

an analog to digital converter configured to convert the reflection signal to a digital format, the conversion controlled at least in part by a clock signal;

a clock signal generator configured provide a clock signal to either or both of the digital to analog converter and the analog to digital converter; and a clock signal modifier configured to modify the clock signal provided to either or both of the digital to analog converter and the analog to digital converter, wherein the sequence signal comprises an M-sequence.

22. A system for generating data, the data for use in locating a line anomaly, the system comprising:

a sequence source configured to provide a sequence signal;

a digital to analog converter connected to receive the sequence signal and convert the sequence signal to an analog waveform;

a transmitter configured to transmit the sequence signal;

a receiver configured to receive a reflection signal, the reflection signal comprising a reflection of the sequence signal;

an analog to digital converter configured to convert the reflection signal to a digital format, the conversion controlled at least in part by a clock signal;

a clock signal generator configured provide a clock signal to either or both of the digital to analog converter and the analog to digital converter; and a clock signal modifier configured to modify the clock signal provided to either or both of the digital to analog converter and the analog to digital converter, wherein the receiver and the transmitter operate in accordance with a digital subscriber line protocol.

23. A system for increasing the resolution of a line probing operation, the system comprising one or more signal generation devices configured to, during two or more cycles of operation, provide an input to a transmit module sampler and an input to a receiver module sampler wherein during at least one cycle of operation the input to the transmit module sampler is out of phase with the input to the receive module sampler.

24. The system of claim 23, wherein a cycle of operation comprises a transmission of a sequence signal and receipt and processing of a reflection of the sequence signal.

25. The system of claim 23, wherein a line probe operation is configured to provide location information regarding a location of a line anomaly.

26. The system of claim 23, wherein the receive module sampler comprises an analog to digital converter and the transmit module sampler comprises a digital to analog converter.

27. The system of claim 23, wherein the receive module sampler comprises an analog to digital converter and a transmit module sampler comprises a digital to analog converter and the input comprise a clock signal.

28. The system of claim 23, wherein the signal generation device comprises an oscillator.

29. A system for locating a line anomaly in a transmission line comprising:

means for transmitting a sequence signal over the transmission line;

means for receiving a reflection signal configured to receive a reflection signal created in response to transmission of a sequence over the line;

means for sampling the reflection signal based on a signal with a first phase to create a first signal;

means for sampling the reflection signal based on a signal with a second phase to create a second signal; and means for correlating the first signal and the second signal with the sequence signal to create one or more points of correlation;

means for calculating a distance to a line anomaly based on the one or more points of correlation.

30. The system of claim 29, wherein a point of correlation with the largest magnitude is used to determine the location of the line anomaly.

31. The system of claim 29, wherein the first phase is different from the second phase.

* * * * *

UNITED STATES PATENT AND TRADEMARK OFFICE
CERTIFICATE OF CORRECTION

PATENT NO. : 6,697,768 B2
DATED : February 24, 2004
INVENTOR(S) : Jones et al.

It is certified that error appears in the above-identified patent and that said Letters Patent is hereby corrected as shown below:

Title page,
Item [56], References Cited, U.S. PATENT DOCUMENTS, please add the following:

References Cited
U.S. PATENT DOCUMENTS

| | | |
|---|---|---|
| 4,041,381 | 08/1977 | Hwa |
| 5,062,703 | 11/1991 | Wong et al. |
| 5,144,250 | 09/1992 | Little |
| 5,514,965 | 05/1996 | Westwood |
| 5,600,248 | 02/1997 | Westrom et al. |
| 5,841,666 | 11/1998 | Perdue et al. |
| 6,161,077 | 12/2000 | Fawcett |
| 6,298,118 | 10/2001 | Liggett |
| 6,385,561 | 05/2002 | Soraghan et al. |
| 6,437,578 | 08/2002 | Gumm |
| 6,509,740 | 01/2003 | Needle et al. |
| 6,532,215 | 03/2003 | Muntz |
| 6,534,996 | 03/2003 | Amrany et al. |

OTHER PUBLICATIONS
Navaneethan, S.; Soraghan, J.J.; Slew, W.H.; McPherson, F.; Gale, P.F.; "Automatic fault location using intelligent processing"; International Conference on Electric Power Engineering; 1999 PowerTech Budapest 99; 29 Aug.-2 Sept. 1999; Page 29.
Navaneethan, S.; Soraghan, J.; Siew, W.; Muirhead, R.; Livie, J.; "An automatic fault detection and location technique in low voltage distribution networks"; Proceedings Int'nl Conf on Energy Management and Power Delivery; Volume 2; March 1998; Pages 732-736.

Column 8,
Line 9, after the word "signal", delete "110".

Column 12,
Line 36, after the word "multiplier", delete "CN" and insert -- $C_N$ --.

Column 20,
Line 8, after the word "represent", delete the "-".

UNITED STATES PATENT AND TRADEMARK OFFICE
CERTIFICATE OF CORRECTION

PATENT NO.   : 6,697,768 B2
DATED        : February 24, 2004
INVENTOR(S)  : Jones et al.

It is certified that error appears in the above-identified patent and that said Letters Patent is hereby corrected as shown below:

Column 32,
Line 53, delete "the refro m" and insert -- therefrom --.
Line 60, delete "out put" and insert -- output --.

Signed and Sealed this

Eleventh Day of May, 2004

JON W. DUDAS
*Acting Director of the United States Patent and Trademark Office*